(12) United States Patent
Tamura et al.

(10) Patent No.: US 6,631,145 B1
(45) Date of Patent: Oct. 7, 2003

(54) WAVELENGTH-TUNABLE MODE-LOCKED LASER, WAVELENGTH CONVERTER AND TRANSMISSION SYSTEM

(75) Inventors: Kohichi Robert Tamura, Yokosuka (JP); Masataka Nakazawa, Mito (JP); Tetsuro Komukai, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 288 days.

(21) Appl. No.: 09/626,727

(22) Filed: Jul. 27, 2000

(30) Foreign Application Priority Data

Jul. 29, 1999 (JP) .......................................... 11-215905

(51) Int. Cl.⁷ .............................................. H01S 3/098
(52) U.S. Cl. .......................................... 372/18; 372/28
(58) Field of Search ....................... 372/18, 28; 385/17, 385/31; 359/124, 135

(56) References Cited

U.S. PATENT DOCUMENTS

| | | | | |
|---|---|---|---|---|
| 5,590,143 A | * | 12/1996 | Takara et al. .................. | 372/28 |
| 5,760,937 A | * | 6/1998 | Ishikawa et al. ............. | 359/135 |
| 6,014,237 A | * | 1/2000 | Abeles et al. ................ | 359/124 |
| 6,122,419 A | * | 9/2000 | Kurokawa et al. ............ | 385/31 |
| 6,208,673 B1 | * | 3/2001 | Miyake ........................ | 372/22 |
| 6,366,716 B1 | * | 4/2002 | Graves ......................... | 385/17 |
| 6,388,782 B1 | * | 5/2002 | Stephens et al. ............. | 359/124 |

OTHER PUBLICATIONS

S.J.B. Yoo, *Wavelength Conversion Technologies for WDM Network Applications, Journal of Lightwave Technology*, vol. 14, No. 6, Jun. 1996, 12 pp.

Haruhisa Soda, Yuji Kotaki, Hisao Sudo, Hiroshi Ishikawa, Sigeyuki Yamakoshi and Hajime Imai, *Stability in Single Longitudinal Mode Operation in GaInAsP/InP Phase–Adjusted DFB Lasers, IEEE Journal of Quantum Electronics*, vol. QE–23, No. 6, Jun. 1987, 11 pp.

Kentaro Kondo, Masaaki Kuno, Shigenobu Yamakoshi, and Kiyohide Wakao, *A Tunable Wavelength–Conversion Laser, IEEE Journal of Quantum Electronics*, vol. 28, No. 5, May 1992, 6 pp.

Vijaysekhar Jayaraman, Zuon–Min Chuang, and Larry A. Coldren, *Theory, Design and Performance of Extended Tuning Range Semiconductor Lasers with Sampled Gratings, IEEE Journal of Quantum Electronics*, vol. 29, No. 6, Jun. 1993, 11 pp.

R. Monnard, C. R. Doerr, C.H. Joyner, M. Zirngibl, and L.W. Stulz, *Direct Modulation of a Multifrequency Laser up to 16 × 622 Mb/s, IEEE Photonics Technology Letters*, vol. 9, No. 6, Jun. 1997, 3 pp.

(List continued on next page.)

*Primary Examiner*—Paul Ip
*Assistant Examiner*—Phillip Nguyen
(74) *Attorney, Agent, or Firm*—Alston & Bird LLP

(57) ABSTRACT

An arrayed-waveguide grating (AWG) is provided in a tunable mode-locked laser resonator where when a clock signal corresponding to a predetermined wavelength is input, the arrayed-waveguide grating (AWG) generates an output signal having an oscillation wavelength which has an arbitrary wavelength interval independent of the wavelength of said clock signal and a different propagation delay for each wavelength. Furthermore, a transmitter and a wavelength converter is provided that uses a tunable mode-locked laser where the frequency of the clock signal determines the wavelength and where a transmitted data signal at a fixed data rate is generated by setting the clock signal frequency sufficiently higher than the data rate. Furthermore, a wavelength converter and wavelength router is provided that uses said tunable mode-locked laser and in which the output wavelength is determined by extracting said clock signal from the input data signal. Furthermore, a transmission system is provided that uses said transmitter and/or said wavelength converter, and a receiver that recovers the envelope of said transmitted data signal.

11 Claims, 34 Drawing Sheets

OTHER PUBLICATIONS

K. Tamura and M. Nakazawa, *Dispersion–tuned harmonically mode–locked fiber ring laser for self–synchronization to an external clock*, Optics Letters, vol. 21, No. 24, Dec. 15, 1996, 3 pp.

Shenping Li, K.T. Chan and Caiyun Lou, *Wavelength–tunable picosecond pulses generated from stable self–seeded gain–switched laser diode with linearly chirped fibre Bragg granting*, Electronics Letters, Jun. 11, 1988, vol. 34, No. 12, 3 pp.

K. Chan and C. Shiu, *Electrical switching of wavelength in actively modelocked fibre laser incorporating fibre Bragg gratings*, Electronics Letters, Jan. 6, 2000, vol. 36, No. 1, 2 pp.

C. R. Doerr, M. Zirngibl, and C. H. Joyner, *Chirping of the Waveguide Grating Router for Free–Spectral–Range Mode Selection in the Multifrequency Laser*, IEEE Photonics Technology Letters, vol. 8, No. 4, Apr. 1996, 3 pp.

K.R. Tamura, T. Komukai, and M. Nakazawa, *A New Optical Routing Technique with a Subcarrier Clock Controlled Wavelength Converter*, ECOC'99, Sep. 26–30, 1999, Nice, France, 2 pp.

K.R. Tamura, T. Komukai, and M. Nakazawa, *A New Optical Routing Technique with a Subcarrier Clock Controlled Wavelength Converter*, IEEE Photonics Technology Letters, vol. 11, No. 11, Nov. 1999, 3 pp.

K.R. Tamura, T. Komukai, and M. Nakazawa, *A Time–to–Wavelength Mapped Mode–locked Laser and Its Application to Wavelength Routing*, Technical Report of IEICE, OFT99–47 (Jan. 2001), 7 pp.

K.R. Tamura, T. Komukai, and M. Nakazawa, *A New Optical Routing Technique Using a Time–to–Wavelength Mapped Mode–locked Laser (TWML)*, NTT Network Innovation Laboratories, The Institute of Electronics, Information and Communication Engineers, Mar. 28–31, 2000, 5 pp.

\* cited by examiner

FIG.21A PRIOR ART METHOD

FIG.21B PRESENT INVENTION METHOD

OSCILLATION CHARACTERISTICS OF
TIME-TO-WAVELENGTH MAPPED
MODE-LOCKED LASER

150

| FREQUENCY OF CLOCK SIGNAL | WAVELENGTH OF THE OUTPUT PULSE TRAIN | REPETITION INTERVAL OF THE OUTPUT PULSE TRAIN |
|---|---|---|
| $f_1$ | $\lambda_1$ | $1/f_1$ |
| $f_2$ | $\lambda_2$ | $1/f_2$ |
| ⋮ | ⋮ | ⋮ |
| $f_N$ | $\lambda_N$ | $1/f_N$ |

OSCILLATION CHARACTERISTICS OF
WAVELENGTH MAPPED DELAY CIRCUIT

| WAVELENGTH OF INPUT/OUTPUT LIGHT | OPTICAL PATH LENGTH | DELAY |
|---|---|---|
| $\lambda_1$ | $\Delta L_{opt}(\lambda_1)$ | $\Delta T(\lambda_1)$ |
| $\lambda_2$ | $\Delta L_{opt}(\lambda_2)$ | $\Delta T(\lambda_2)$ |
| .. | .. | .. |
| $\lambda_N$ | $\Delta L_{opt}(\lambda_N)$ | $\Delta T(\lambda_N)$ |

160

THE OPTICAL PATH LENGTH IS THE DISTANCE FROM THE INPUT END TO THE OUTPUT END.

$\Delta T(\lambda_i) = \Delta L_{opt}(\lambda_i)/c$
(RELATION BETWEEN THE AMOUNT OF DELAY AND THE OPTICAL PATH LENGTH)
C: SPEED OF LIGHT IN VACUUM

WAVELENGTH-TUNABLE MODE-LOCKED LASER, WAVELENGTH CONVERTER AND TRANSMISSION SYSTEM

This application is based on Japanese Patent Application No. 11-215905 (1999) filed Jul. 29, 1999, the content of which is incorporated hereinto by reference.

BACKGROUND OF THE INVENTION

1. Field of the Invention

This invention relates to a wavelength-tunable mode-locked laser, a wavelength converter and a transmission system that are applicable to, for example, optical communication networks utilizing fast wavelength conversion and wavelength routing.

2. Description of the Related Art (First Example of Prior Art)

For implementation of optical communication networks that utilize the wavelength division multiplexing method, the wavelength converter plays an important role in changing the wavelength of optical signals. Research conducted by S. J. B. Yoo Wavelength Conversion Technologies for WDM Network Applications Journal of Lightwave Technology, Vol. 14, No. 6, pp. 955–66 (June 1996), for example, is part of the associated wide-range investigation. Among many methods for wavelength conversion, the architecture focused on in this invention particularly relates to technology to convert transmitted optical information into an output light of a different wavelength by the use of a wavelength-tunable light source.

There are two types of methods for wavelength conversion for the above purpose: one is a wavelength selection by a network management system; and the other is that conducted by the transmitted optical signal itself.

FIGS. 34 and 35 illustrate typical configurations of wavelength converters of the two methods.

Referring now to FIG. 34, optical signal 15 is guided to a receiver 13 to decode the information signal. By an optical modulator 12, which is driven by this information signal, the output light from a wavelength-tunable light source 11 can be provided as optical signal 16 of which wavelength has been converted.

The wavelength of light emitted from the wavelength-tunable light source 11 is controlled by control signals sent from a network management system 17 via an information processing circuit 14. The information processing circuit 14, interpreting the control information, provides current and voltage which are necessary to change the wavelength of light emitted from the wavelength-tunable light source.

In the case of the wavelength converter shown in FIG. 35, the control signal is directly decoded by the information processing circuit 24, based on the optical signals under transmission. Namely, the optical information signal 25 has both communications information and control information. This control information included in information signals is called "header" and the signal originator can send information about wavelength conversion to intermediate nodes in the network by the use of this header.

The wavelength conversion described in FIG. 35 is the same as that performed in the wavelength converter of FIG. 34, where a receiver 23 corresponds to the receiver 13, and an optical modulator 22 to the optical modulator 12.

(Second Example of Prior Art)

The time-to-wavelength mapped laser of prior art is a wavelength-tunable mode-locked laser of which oscillation wavelength is changed by the repetition frequency of the resonator. It has several advantages such as simple structure, fast wavelength conversion and easy wavelength selection.

FIG. 37 illustrates general properties of oscillation 150 of the above laser.

Referring to FIG. 37, there are several clock frequencies fi for input clock signals. When a clock signal is applied to laser, a synchronous oscillation (pulse oscillation) occurs at a repetition frequency $f_i$ and a wavelength of $\lambda_i$.

Since one clock frequency provides one oscillation wavelength, the oscillation frequency of laser is determined by selecting a clock frequency $f_i$ of the clock signal.

FIG. 27 is a block diagram illustrating the configuration of the time-to-wavelength mapped mode-locked laser (detail explanation will be provided later).

In FIG. 27, wavelength mapped delay circuit 1-4 in laser resonator 1-1 is a circuit that provides a different propagation delay to light of each wavelength (namely, optical path length). The oscillation characteristics are shown in FIG. 38.

In FIG. 38, there are as many as N wavelengths as input wavelength $\lambda_i$. Each wavelength has an intrinsic optical path length $\Delta L_{opt}(\lambda_i)$ and corresponding propagation delay $\Delta T(\lambda_i)$.

When the light of wavelength $\lambda_i$ enters a time-to-wavelength mapped circuit, it travels a length $\Delta L_{opt}(\lambda_i)$ before going out, and the light is given a propagation delay $\Delta T(\lambda_i)$ corresponding to $\Delta L_{opt}(\lambda_i)$. The optical path length is a product of physical length $\Delta L(\lambda_i)$ and refractive index n, namely, $\Delta L_{opt}(\lambda_i) = n \Delta L(\lambda_i)$. With "c" being the speed of light in vacuum, the relationship between propagation delay and optical path length is expressed by $\Delta T(\lambda_i) = \Delta L_{opt}(\lambda_i)/c$.

In FIG. 27, when a wavelength mapped delay circuit 1-4 is inserted in the laser resonator 1-1, the total optical path length $L_{opt}(\lambda_i)$ in the whole laser resonator and the corresponding primary repetition interval $T(\lambda_i)$ (primary repetition frequency $f^{(T)}_i = 1/T(\lambda_i)$) change depending on each wavelength.

By the modulation conducted in optical modulator 1-3 at the frequency equal to the primary repetition interval (namely, repetition interval $T(\lambda_i)/m$, m>0), a mode-locked oscillation occurs at the wavelength $\lambda_i$ that corresponds to this interval.

Because the other wavelengths are transmitted in the resonator 1-1 at intervals that do not match the modulation interval, oscillation of the other wavelengths is suppressed. In other words, the oscillation wavelength of time-to-wavelength mapped laser is selected by setting the frequency of a clock signal for driving the optical modulator 1-3.

In the laser emission shown in FIG. 27, a driver 1-15 generates driving signal 1-14. A clock signal generator 1-8 in the driver provides clock signal 1-9. One of clock signals of frequencies $f_1, f_2 \ldots f_N$, provided by the clock signal generator 1-8, is selected by a clock signal selecting unit 1-7.

The driving signal 1-14 comprises clock signal 1-9 and DC bias signal 1-12. The DC bias signal 1-12 is necessary for setting the operation point of the optical modulator 1-3. DC bias signal 1-12 is generated by the DC bias signal generator 1-11 and its signal level is adjusted by a DC bias signal adjusting unit 1-10. A synthesizing unit 1-13 combines clock signal 1-9 and DC bias signal 1-12.

(Third Example of Prior Art)

Since light transmission is performed at a standard transmission rate (for example, 155.52 Mbps in STM1), a pulse light source where the repetition frequency is fixed in accordance with the transmission rate or a light source that emits beams of continuous wave light (cw light source) is employed.

FIG. 21A shows an example of transmission signals that are sent by the prior art transmission method employing a pulse light source. There is a one-to-one relation between light pulse and data bit.

(First Example of Problems in Prior Art)

First, one of the disadvantages in prior art will be explained below. In the architecture of prior art, the wavelength converters shown in FIGS. 35 and 36 each require information processing circuit 14 or 24 to select a wavelength.

Signals entered into those circuits are control information that includes information about the wavelength of output light. The control signal is written in binary code, for example. The format of signals required to change the wavelengths of light emitted from the wavelength-tunable light source 11 or 21 depend on each light source.

The wavelength can be controlled by changing the input current and device temperature when a wavelength-tunable semiconductor laser (such as distributed feedback semiconductor laser [G. Soda, Y. Kotaki, H. Ishikawa, S. Yamakoshi, H. Sudo and H. Imai, Stability in Single Longitudinal Mode Operation in GaInAsP/InP Phase-adjusted DFB Lasers, IEEEJ, Quantum Electronics, vol.23, pp. 804–14 (1987)], distributed Bragg reflector semiconductor laser [K. Kondo, M. Kudo, Yamakoshi and K. Wakao, A Tunable Wavelength-Conversion Laser, IEEE, Quantum Electronics, vol.28, pp.1343–1348(1992)], sample grating semiconductor laser [V. Jayaraman, Z. M Chuang and L. A. Coldren, Theory, Design, and Performance of Extended Tuning Range Semiconductor Lasers with Sampled Gratings IEEEJ, Quantum Electronics, pp.1824–1834, (June 1993) is used.

The information processing circuit, therefore, is required to output injection current and voltage, for example, to provide a desired wavelength.

There is another type of a wavelength-tunable light source that oscillates at many different wavelengths: [J. Ishikawa and T. Chikama, Japanese Patent Application Laid-open No. 6-188517 (1994); R. Monnard, C. R. Doerr, C. H. Joyner, M. Zirngibl and L. W., Stulz, Direct Modulation of a Multifrequency Laser up to 16×622 Mb/s, IEEE Photonics Technology Letters, vol.9, pp.815–817, (June 1997)].

Such light sources have a number of semiconductor laser arrays each of which produces a different wavelength, and the wavelength selection is made by oscillating one of the laser devices that provides the desired wavelength.

In this case, the information processing circuit is required to output injection current, for example, to oscillate a proper laser device.

The extra components such as an information processing circuit make the structure of the wavelength converter more complex and cause the cost to be increased.

Further, in the case of a wavelength converter shown in FIG. 36, the header has to be decoded and processed very fast, because the control information is part of transmitted optical signals. This header processing could be accomplished by a special IC (logic circuit) but it is difficult to manufacture such IC at present.

(Second Example of Problems in Prior Art)

Next, a second example of problems in prior art will be explained below.

Referring now to FIG. 27, the prior art time-to-wavelength mapped laser employs an optical fiber of which wavelength dispersion is high or a distributed Bragg grating (DBG) as a wavelength mapped delay circuit 1-4.

This structure employing these components, however, has following problems.

First, when using an optical fiber, a long fiber (several tens to several hundred meters) is required to provide a delay large enough for operation, because the dispersion per unit length of optical fiber is small. Then it becomes difficult to stabilize the operation of laser resonator 1-1. Also since the wavelength conversion rate is proportional to the length of the resonator, it is difficult to realize a fast conversion.

When using a distributed Bragg grating (DBG), it is possible to make the equipment compact. But, in turn, it becomes difficult to provide an arbitrary wavelength interval and propagation delay since the reflection band of the distributed Bragg grating is inversely proportional to its physical length.

In particular, when a short wavelength interval (for example, 50 GHz or 100 GHz) is required, the physical length of each DBG for a given wavelength becomes 5 mm or longer. Then the whole length of DBG becomes very large and the system becomes difficult to design.

In addition, both methods have a common problem that the frequency of clock signal cannot be arbitrarily controlled with oscillation wavelength because the amount of propagation delay for each wavelength cannot be controlled separately.

(Third Example of Problems in Prior Art)

Since the repetition frequency of time-to-wavelength mapped laser changes with wavelength, only wavelength that has the same repetition frequency as the transmission rate is usable in the transmission system of prior art. To solve this problem, some methods have been presented (K. Tamura and M. Nakazawa, Dispersion-tuned harmonically mode-locked fiber ring laser for self-synchronization to an external clock, Optics Letters, vol. 21, pp. 1984–1986 (1996); S. Li, K. T., Chan and C. Lou, Wavelength-tunable picosecond pulses generated from stable self-seeded gain-switched laser diode with linearly chirped fibre Bragg grating, Electronics Letters, vol. 34, No. 12, p. 1234–1236 (1998); and K. Chan and C. Shu, Electrical switching of wavelength in actively modelocked fibre laser incorporating fibre Bragg gratings Electronics Letters, vol.36, No.1, p.42–43(2000)).

Those proposals, however, have problems such as complex structure of laser equipment, increased cost and degradation of performance, because they require, for example, that the length of resonator has to be variable and that two optical modulators are necessary.

SUMMARY OF THE INVENTION

Accordingly, it is an object of the present invention to provide a wavelength-tunable mode-locked laser that can generate output signal having an oscillation wavelength which has an arbitrary wavelength interval independent of the wavelength of the clock signal and a different propagation delay for each wavelength.

Another object of the present invention is to provide a transmission system that conducts transmission at a constant transmission rate, with the repetition frequency of time-to-wavelength mapped mode-locked laser being changed.

Still another object of the present invention is to provide a wavelength-tunable mode-locked laser and a transmission system that can easily decode control signals from optical information signals by the use of a simple configuration of equipment that eliminates the need for complex information processing circuits.

The above and other objects, effects, features, and advantages of the present invention will become more apparent from the following description of embodiments thereof taken in conjunction with the accompanying drawings.

BRIEF DESCRIPTION OF THE DRAWINGS

FIG. 37 is an illustrative-table showing the oscillation characteristics of a time-to-wavelength mapped mode laser of prior art; and FIG. 38 is an illustrative table showing the oscillation characteristics of a wavelength mapped delay circuit of prior art.

DETAILED DESCRIPTION OF PREFERRED EMBODIMENTS

Now referring to associated drawings, the preferred embodiments of the present invention will be described below in detail.

FIRST EXAMPLE

Referring to FIGS. 1–7, a first example of the invention is explained below.

(Configuration of Wavelength Converter)

First, the overall structure of the equipment is described.

Figure 1:
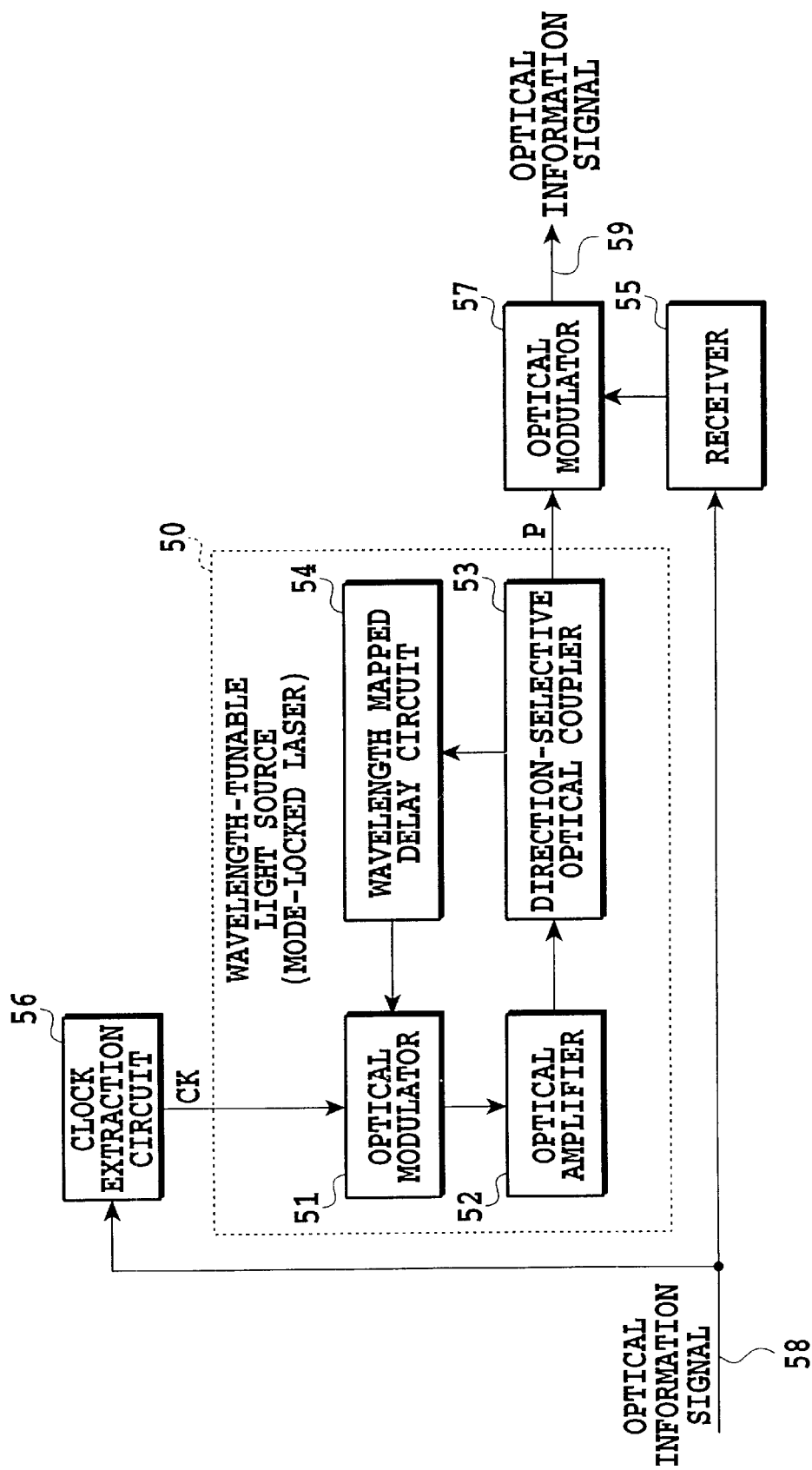
FIG. 1 is a schematic diagram illustrating the configuration of a wavelength converter of a first example of the invention.

FIG. 1 is a schematic diagram of the wavelength converter according to the present invention, and a wavelength is selected from the transmitted optical information signal 58.

This equipment comprises a wavelength-tunable light source 50, a receiver 55 that decodes information signals from the optical information signal 58, a clock extraction circuit 56 that extracts a clock signal CK included in the optical information signal 58, and an optical modulator 57 that modulates the output light emitted from the wavelength-tunable light source 50 based on the information signals.

The wavelength-tunable light source 50 is a ring-cavity-type resonator for mode-locked laser and its wavelength is mapped over the frequency of clock signal CK. The wavelength-tunable light source 50 is equipped with an optical modulator 51, an optical amplifier 52, a direction-selective optical coupler 53, and a wavelength mapped delay circuit 54.

The optical modulator 51 comprises a Mach-Zehnder-type $LiNbO_3$, modulator, electro-absorption(EA) type modulator or a gain modulated semiconductor optical amplifier.

The optical amplifier 52 is a semiconductor optical amplifier or an amplifier equipped with a waveguide where rare-earth elements are doped.

The direction-selective optical coupler 53 is a device to take out output wavelength-modulated light P from inside the resonator 50 by changing the frequency of clock signal CK.

The receiver 55 includes an electric receiver that operates at a transmission rate R.

The clock extraction circuit 56 consists of a combination of an RF filter of the clock frequency band and an RF amplifier.

The detail structure of the wavelength mapped delay circuit 54 will be described later.

(Operation of Wavelength Converter)

Next, the operation of the wavelength converter is explained below.

The clock signal CK is multiplexed over the transmitted optical information signal 58 as a sub-carrier. This optical information signal 58 is entered into the receiver 55 and the clock extraction circuit 56.

The receiver 55 receives the optical information signal 58 and then decodes it to take out information signals. The decoded information signals are then entered into the optical modulator 57.

The clock extraction circuit 56 extracts the clock signal CK that has been merged into the optical information signal 58. This extracted clock signal CK for mode-locking drives the optical modulator 51 in the resonator configured as a ring-type wavelength-tunable light source 50.

The optical modulator 51 outputs a modulated light signal and this light signal is amplified by the optical amplifier 52. This amplified light signal is entered into the wavelength mapped delay circuit 54 via a direction-selective coupler 53. This delay circuit 52 provides the entered light signal with a different propagation delay for each wavelength. In this invention, the light signal that has been provided with a propagation delay is referred to as delay signal. By changing the frequency of clock signal CK based on this delay signal, the wavelength of output light P emitted from the wavelength-tunable light source 50 can be controlled. The output light P of which wavelength has been altered is then output to the optical modulator 57.

The optical information signal 59 is now obtained by modulating the output light of the mode-locked laser by the use of decoded information signals in the optical modulator 57.

Thereby, the complex information processing circuit can be saved that has been a necessary component in the wavelength converter of prior art because a simple clock extraction circuit 56 (only consisting of an electric filter and an electric amplifier) executes the conversion of wavelength.

In this example a ring-cavity type resonator was used, but a linear-cavity type resonator can also be used to obtain similar results.

(Conditions for Mode-locked Oscillation)

The following are the conditions required for stable mode-locked oscillation of laser.

In general, a stable mode-locked oscillation is realized when the repetition frequency $f_c$ (clock frequency) of the clock signal that drives the optical modulator agrees with the repetition frequency $f_f$ that corresponds to the propagation time of light traveling in the resonator ($f_c=f_f$)

The value of $f_c$ is selective because it is generated by an electric oscillator. On the other hand, the value of $f_f$ is regarded as fixed by the physical dimensions of the laser resonator because its magnitude is determined by the time $T_L$ that laser takes to make a round trip in the laser resonator.

$T_L$ is expressed by:

$$T_L = nL/c \qquad (1),$$

where n is refractive index and c the speed of light.

The relationship between $f_f$ and $T_L$ is given by:

$$f_f = m/T_L \qquad (2),$$

where m is a positive integer.

Since the mode-locked laser used in the present invention employs a wavelength mapped delay circuit and therefore L(accordingly $T_L$) is dependent on oscillation wavelength λ [L=L(λ)], $T_L=T_L(λ)$], $f_f$ is also dependent on λ.

In this case, when a clock frequency $f_c$ is applied to the modulator, a stable mode-locked oscillation occurs at wavelength λ that fulfills the following relation:

$$f_c = f_f(λ) \qquad (3).$$

At other wavelengths, the above requirement is not met and oscillation does not occur. The magnitude of λ thus becomes selective by choosing the value of $f_c$.

(Wavelength Mapped Delay Circuit)

Now the design of the wavelength mapped delay circuit 54 is considered below.

The laser resonator is considered to be separated by the wavelength mapped delay circuit 54 into a part of length $L_o$ that is independent of wavelength and the other part of length ΔL(λ) that is dependent on wavelength (ΔL(λ)<<$L_o$). In this case, the repetition frequency $f_f$ is given by:

$$f_f = mc/(nL(λ)) \approx (mc/(nL_o))(1-ΔL(λ)-L_o) \approx f_o - Δf(λ) \qquad (4),$$

where nL(λ)/c is the propagation delay (second), $f_o=mc/(nL_o)$, and $Δf(λ)=mf_o(ΔL(λ)/L_o)$.

In equation (4), if n=1.5, c=3×10$^8$ m/s, m=250, and $L_o$=10 m, then $f_o$=10 GHz. For Δf=1 MHz, ΔL=1 mm is required.

Equation (4) provides the repetition frequency $f_f$ for each wavelength λ. A wavelength can be selected by driving the optical modulator with a clock signal ($f_c$) of frequency $f_r$ that is intrinsic to each wavelength. In other words, the repetition frequency $f_f$ given by equation (4) depends on propagation delay nL(λ)/c, and the clock frequency can be changed according to the magnitude of this propagation delay.

(Example of Configuration for Wavelength Mapped Delay Circuit)

Next, a specific configuration of the wavelength mapped delay circuit 54 is described below.

Figure 2:
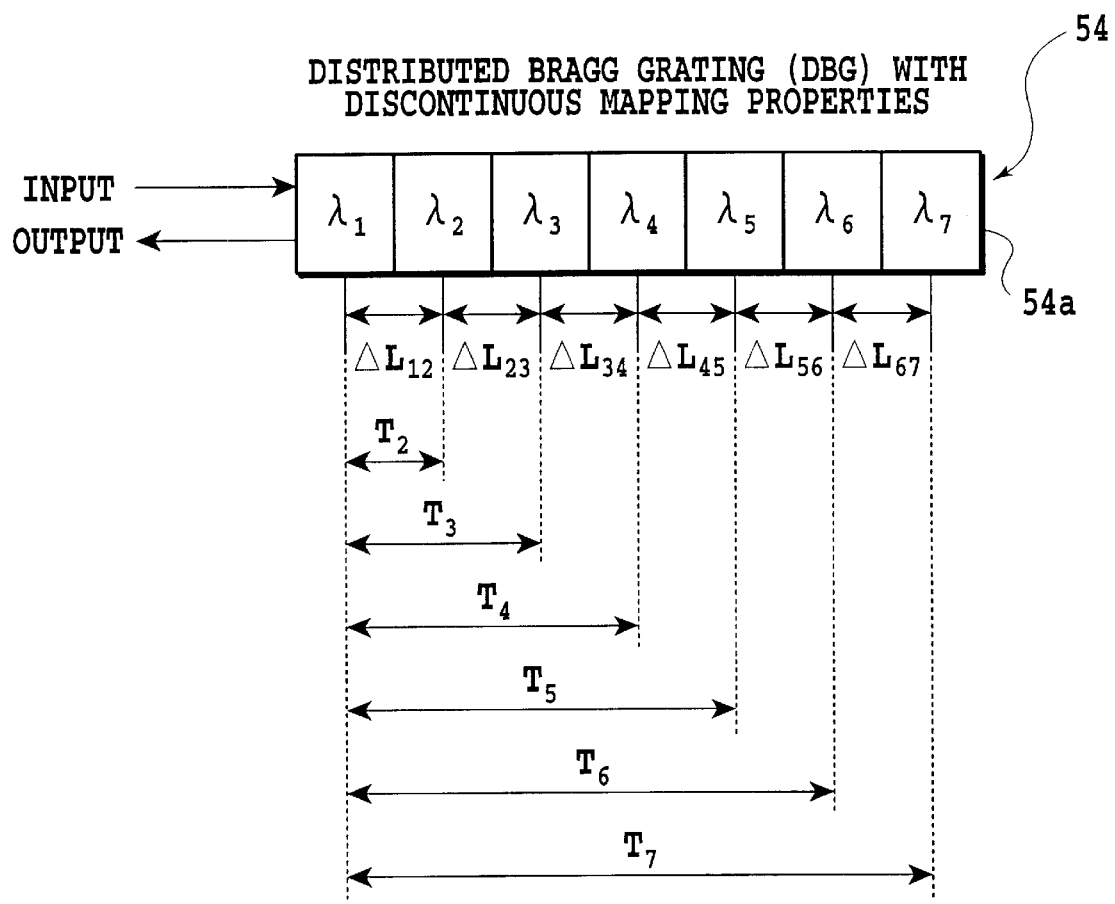
FIG. 2 is a schematic diagram of distributed Bragg gratings (DBG) serially connected to each other.

FIG. 2 is a schematic diagram of distributed Bragg gratings (DBG) used as the wavelength mapped delay circuit 54 where the Bragg reflection wavelength changes discontinuously.

The wavelength of light is determined by Bragg wavelength $\lambda_k(\lambda_1-\lambda_7)$ and the repetition frequency is determined by the location of each BG.

To be more specific, when the wavelength mapped delay circuit 54 consists of seven delay devices 54a, the wavelength of each grating is set at $\lambda_1-\lambda_7$, and the physical length of each interval between gratings is set at $\Delta L_{12}$, $\Delta L_{23}$, $\Delta L_{34}$, $\Delta L_{45}$, $\Delta L_{56}$ and $\Delta L_{67}$, the delay time $T_k$ given to wavelength $\lambda_k$ when a signal enters the seven delay devices 54a, reflects there and goes out is expressed by:

$$T_k = 2\sum_{j=1}^{k-1} \frac{\Delta L_{j,j+1}}{C} (k>1). \quad (5)$$

In this case, the delay given to $\lambda_1$ is zero and c is the speed of light.

The change in wavelength of mode-locked laser using the wavelength mapped delay circuit 54 becomes discontinuous. Since the order of Bragg wavelengths can be set at an arbitrary value, desired wavelength/delay mapping characteristics can also be provided. Then the clock wavelength/frequency characteristics are thereby obtained as desired.

Figure 3:
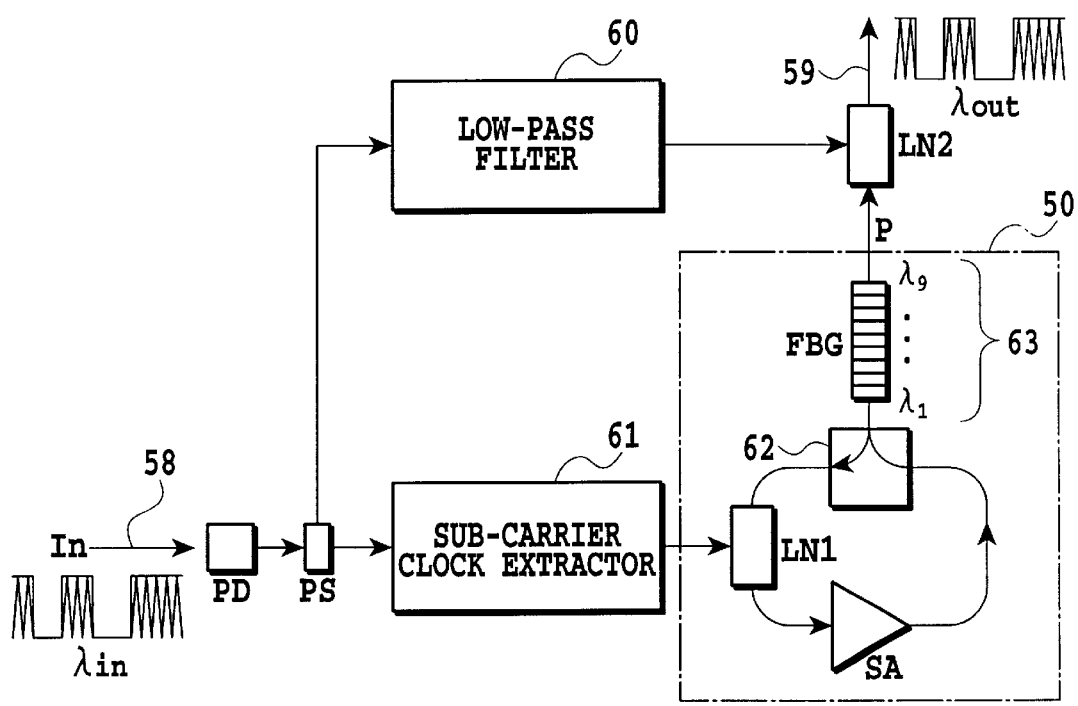
FIG. 3 is a schematic diagram of an experimental system of a wavelength converter employing DBG of FIG. 2.

FIG. 3 is an example of the wavelength converter of FIG. 1, made by connecting DBG 54 of FIG. 2 in serial.

The mode-locked laser resonator comprising the wavelength-tunable light source 50 has a LiNbO₃ optical modulator LN1, a semiconductor optical amplifier SA of the 1.5 μm band, a polarized optical circulator 62, and optical fiber Bragg grating (FBG) 63.

A wavelength mapped delay circuit 54 can be formed by connecting nine FBGs 63 of different wavelengths in serial. The reflection wavelengths in FBGs 63 are set in a range from 1543 to 1559 nm at an interval of 2 nm by the use of wavelength grids.

The difference in delay between neighboring grids in FBGs 63 is 200/9=22.22 ps and each length of FBGs 63 is 2.283 mm. If a 10 GHz-band clock signal is employed, the wavelength changes in the order of $\lambda_5-\lambda_9-\lambda_4-\lambda_8-\lambda_3-\lambda_7-\lambda_2-\lambda_6-\lambda_1$ according to increase in the frequency of clock signal CK. The reflection wavelength in DBGs 63 is set to increase gradually (like $\lambda_1<\lambda_2<\lambda_3$ ... ).

Now the operation shown in FIG. 3 is explained below.

The transmitted optical information signal 58 is detected by the receiver PD and then the information signal and clock signal CK are simultaneously decoded. These decoded signals are split by a power splitter PS (direction-selective coupler) and guided to the low-pass filter 60 and a sub-carrier clock extractor 61. The output signal from the low-pass filter is guided to an optical modulator LN2. The output signal from the sub-carrier clock extractor 61 is guided to an optical modulator LN1(LiNbO₃).

In this configuration, the low-pass filter 60 corresponds to the receiver 55 of FIG. 1 and the sub-carrier clock extractor 61 to the clock extraction circuit 56 of FIG. 1. The optical modulator N1 corresponds to the optical modulator 51 of FIG. 1 and the semiconductor optical amplifier SA to the optical amplifier 52 of FIG. 1. The optics circulator 62 and the seven delay devices (DBG) 54a comprise the wavelength mapped delay circuit 54.

Although the device array comprising the resonator of FIG. 3 is different from that of FIG. 1, there is no difference in their operation. In FIG. 3 the direction-selective coupler 53 is not used as a means to take out light from the laser. This is because the delay device 54a provides a transmitted light.

By changing the frequency of clock signal CK, the wavelength-converted output light P emitted from the wavelength-tunable light source 50 is guided to the optical modulator LN2. The optical modulator LN2 modulates the output light P according to the output signal from the low-pass filter 60, and a required information signal 59 is obtained. The optical modulator LN2 corresponds to the optical modulator 57 of FIG. 1.

(Experimental Results)

Figure 4:
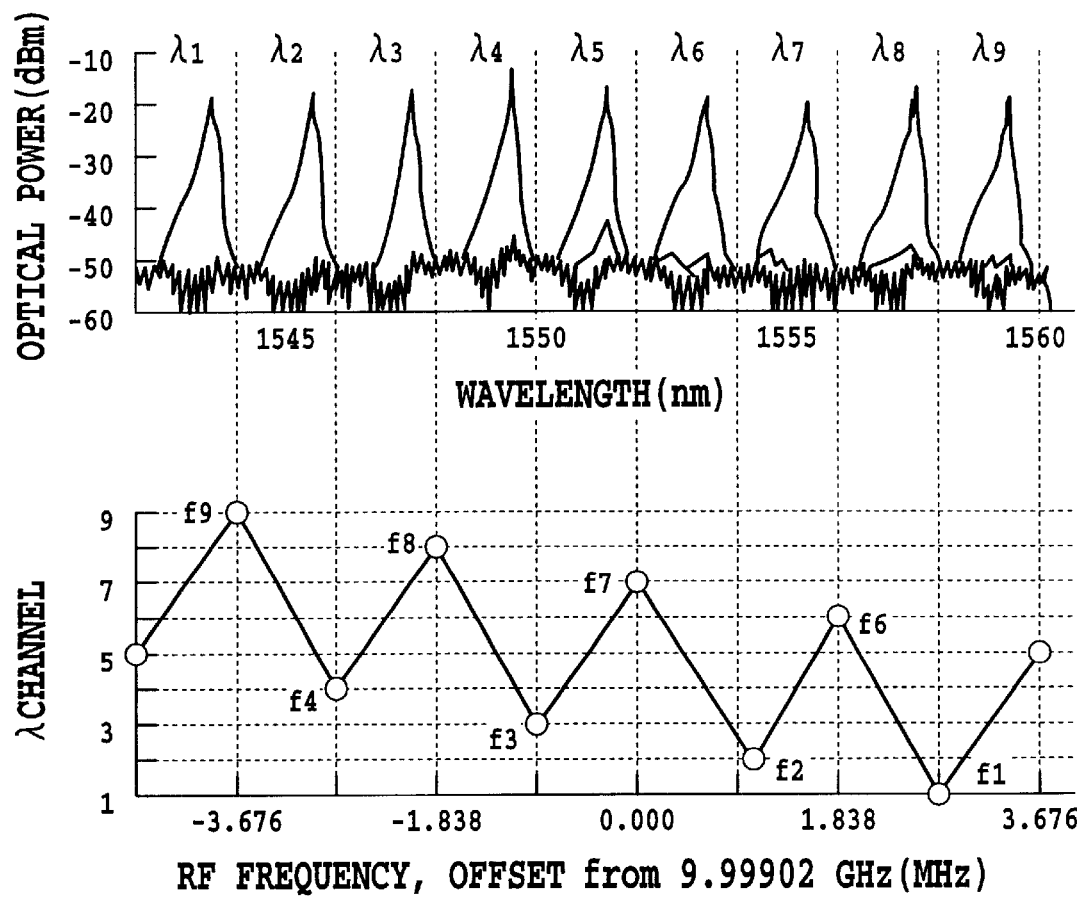
FIG. 4 is a graph illustrating the output spectra and the characteristics (discontinuous mapping characteristics) of change in wavelength depending on the frequency of a sub-carrier clock signal.
Figure 5:
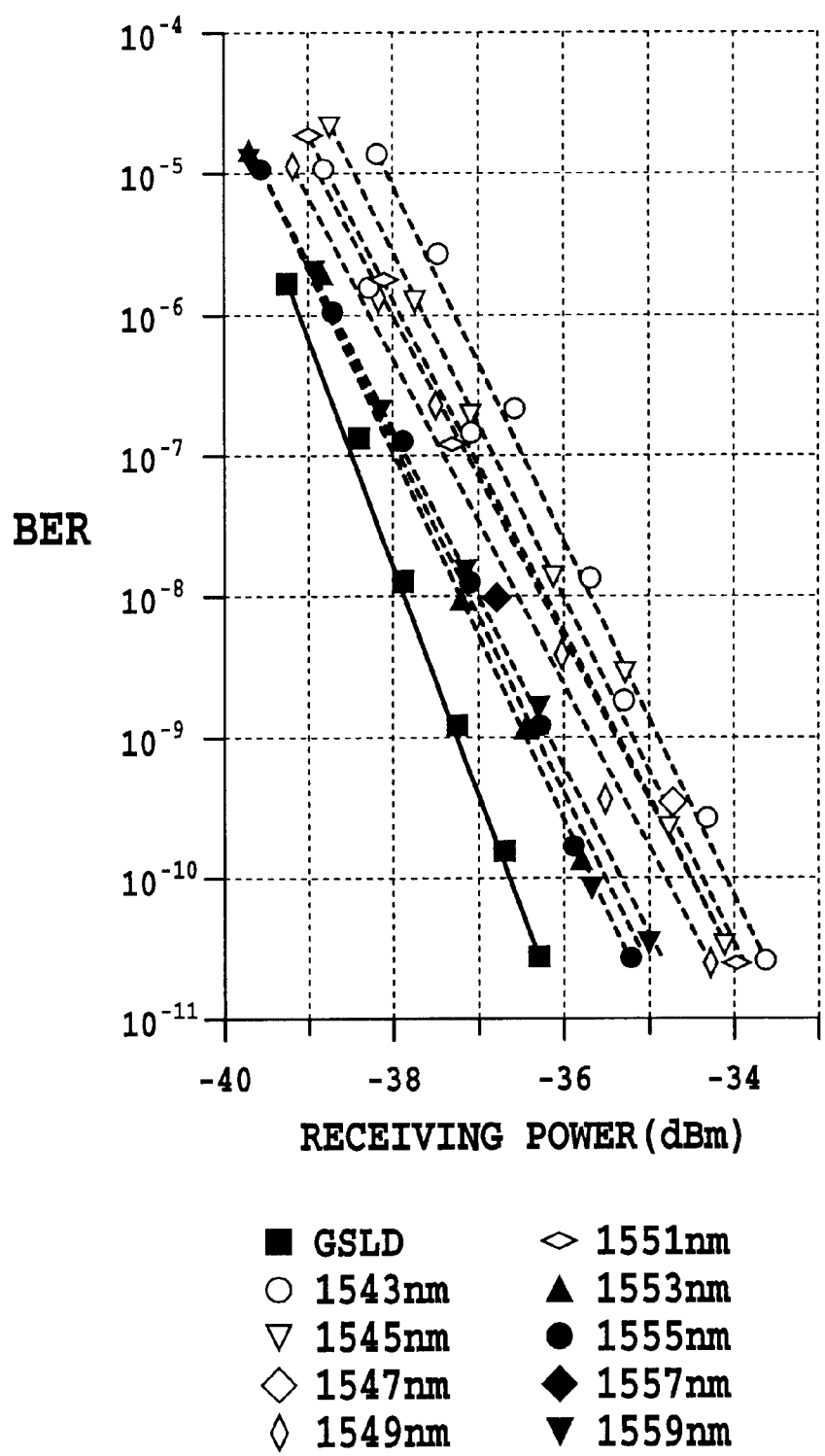
FIG. 5 is a graph illustrating the error rate during conversion of transmitted optical information signals.

FIGS. 4 and 5 show the results of wavelength conversion conducted at a transmission rate 2.5 Gbps.

The wavelength of the input light is 1550 nm. FIG. 4 shows the spectrum of an output light when the wavelength conversion is conducted over nine wavelengths. FIG. 5 shows the error rate during conversion of the input light (from GSLD: gain switch laser diode) into output light. This figure indicates that a good error rate is obtained.

As mentioned before, since the wavelength-tunable laser is made of a mode-locked laser using the wavelength mapped delay circuit 54, one oscillation wavelength is selected by one clock frequency based on the frequency of the clock signal that drives the optical modulator in the resonator and it becomes easy to select a wavelength as desired. Namely, in FIG. 1, when the optical modulator 51 is driven by clock signals, a mode-locking (stable pulse emission) is realized at the wavelength where the propagation time of light in the resonator agrees with the modulation repetition time.

If the wavelength mapped delay circuit 54 is designed to provide an intrinsic propagation time for each wavelength, there exists only one wavelength $\lambda_i$ that agrees with the clock signal of frequency $f_i$ and oscillation of light beams of the other wavelengths is impeded because their oscillation timings do not match with the modulation timing. Therefore, the selection of wavelength becomes easy and, as a result, the wavelength selection circuit, which has a complex structure in the prior art, can be simplified.

(Light Intensity)

Figure 6:
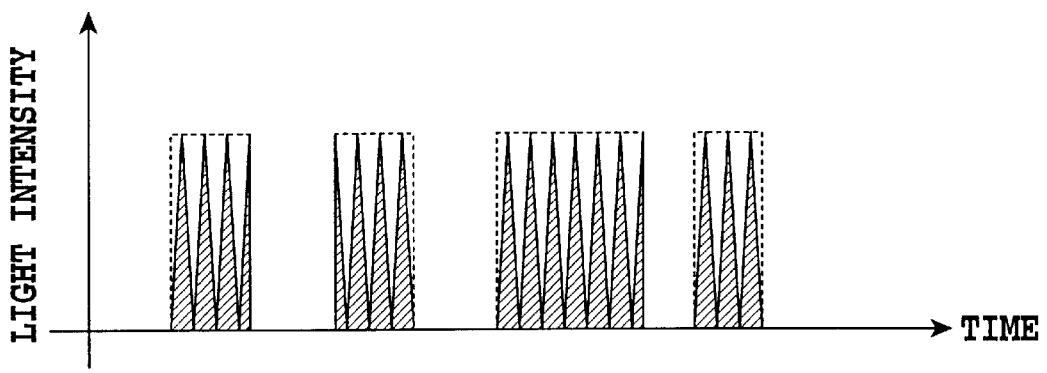
FIG. 6 is a schematic drawing illustrating the light intensity of binary amplitude code that is modulated by a sub-carrier.
Figure 7:
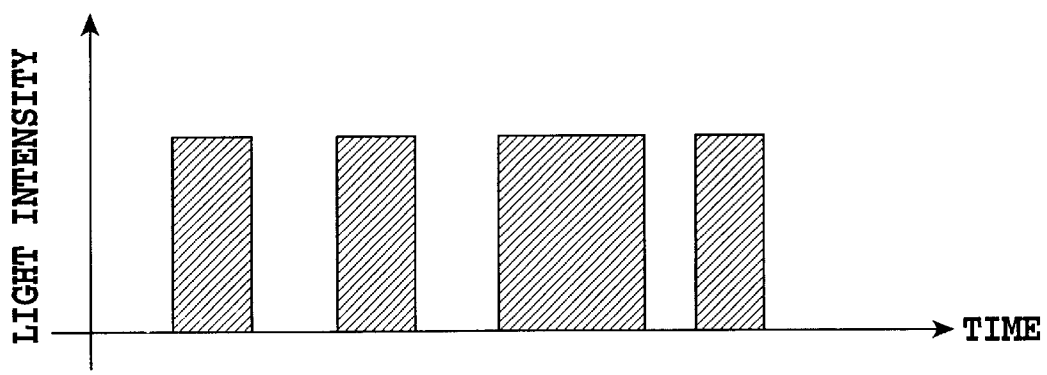
FIG. 7 is a schematic drawing illustrating the light intensity of ordinary binary amplitude code.

FIG. 6 shows an example of the intensity-time relationship of information- and subcarrier-modulated optical signals. Necessary clock signals for wavelength conversion can be extracted from this sub-carrier.

Since the wavelength converter of prior art employs a CW (continuous wave) wavelength-tunable light source, the waveform depicted with regard to time and intensity presents a profile like that shown in FIG. 6.

The wavelength converter of FIG. 1 decodes the clock signal CK directly from the transmitted optical information signal 58. In this case, the waveform of the transmitted optical information signal 58, if depicted with regard to time and intensity, presents a profile like that shown in FIG. 7.

The clock signal CK is extracted from the light transmitted from the clock extraction circuit 56. The wavelength selection can be easily performed by driving a mode-locked laser through the use of this clock signal CK. Since the clock extraction circuit 56 is a simple circuit consisting of an electric filter and an electric amplifier, a complex information processing circuit that is a necessary component in the prior art wavelength converter can be saved. As a result, it becomes easy to control the wavelength selection from the originating side.

SECOND EXAMPLE

Now a second example of the invention is explained below with reference to FIG. 8. Description of the like components referred to in the first example is omitted and like components have like numbers.

Figure 8:
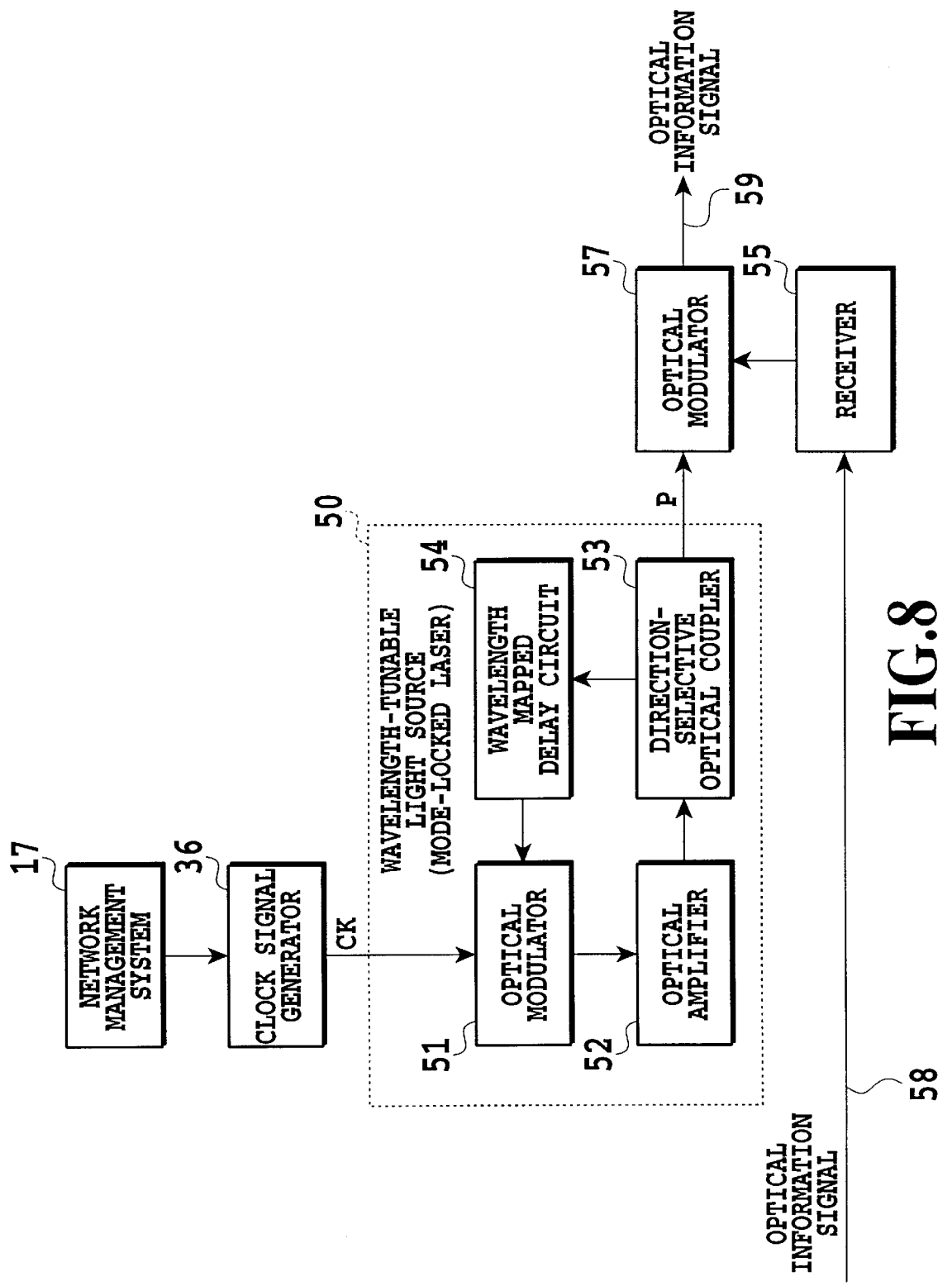
FIG. 8 is a schematic diagram illustrating the configuration of a wavelength converter of a second example of the invention.

FIG. 8 is an example of the configuration of the wavelength converter when the selection of a wavelength is conducted by an external system.

The wavelength-tunable light source 50 has a structure similar to that of FIG. 1, comprising an optical modulator 51 an optical amplifier 52 a direction-selective coupler 53, and a wavelength mapped delay circuit 54 that provides an intrinsic propagation delay for the passing light of each different wavelength. Those components makes up a mode-locked laser resonator as a whole.

The clock signal CK, which is used to modulate the mode-locked laser, can be obtained from a clock signal generator installed inside the equipment or the transmitted optical information signal 58 as mentioned before.

This is an example of the resonator employing a clock signal generator 36, where the control of the frequency of clock signal CK is conducted by a network management system 17. A voltage-controlled electric RF generator can be used as the clock signal generator 36.

Then the clock signal CK for mode-locking is sent from the network management system 17 to the optical modulator 51 via the clock signal generator 36.

The oscillation frequency corresponds to the frequency of clock signal CK. In other words, a wavelength can be selected by changing the frequency of clock signal CK. By changing the frequency of clock signal CK, the wavelength of the output light P emitted from the wavelength-tunable light source 50 can be controlled.

On the other hand, the information signal in the optical information signal 58 is decoded by the receiver 55 and then sent to the optical modulator 57. By driving the optical modulator 57 with this decoded information signal, information can be multiplexed over the wavelength-converted optical information signal 59.

However, the relation $f_i \gg R$ (R: information transmission rate) is required for low error-rate communications. The wavelength-converted optical information signal 59 is modulated by information and sub-carrier clock of frequency $f_i$.

The control information in the wavelength converter becomes the frequency of clock signal CK. An advantage in the present method, therefore, is that the information processing circuit that the prior art wavelength converter needs can be saved.

THIRD EXAMPLE

A third example of the invention is explained with reference to FIGS. 9 and 10. Description of the like components referred to in the first and second examples is omitted and like components have like numbers.

This embodiment shows another configuration of the wavelength mapped delay circuit 54.

This example shows a configuration for the wavelength mapped delay circuit 54 using an arrayed-waveguide gratings (AWG) 80.

AWG 80 comprises an input and output terminal 81, a star coupler 82, an arrayed waveguide 83, a star coupler 84, an emission end 85, split-wave emission end 86 and a reflection face 87.

Figure 9:
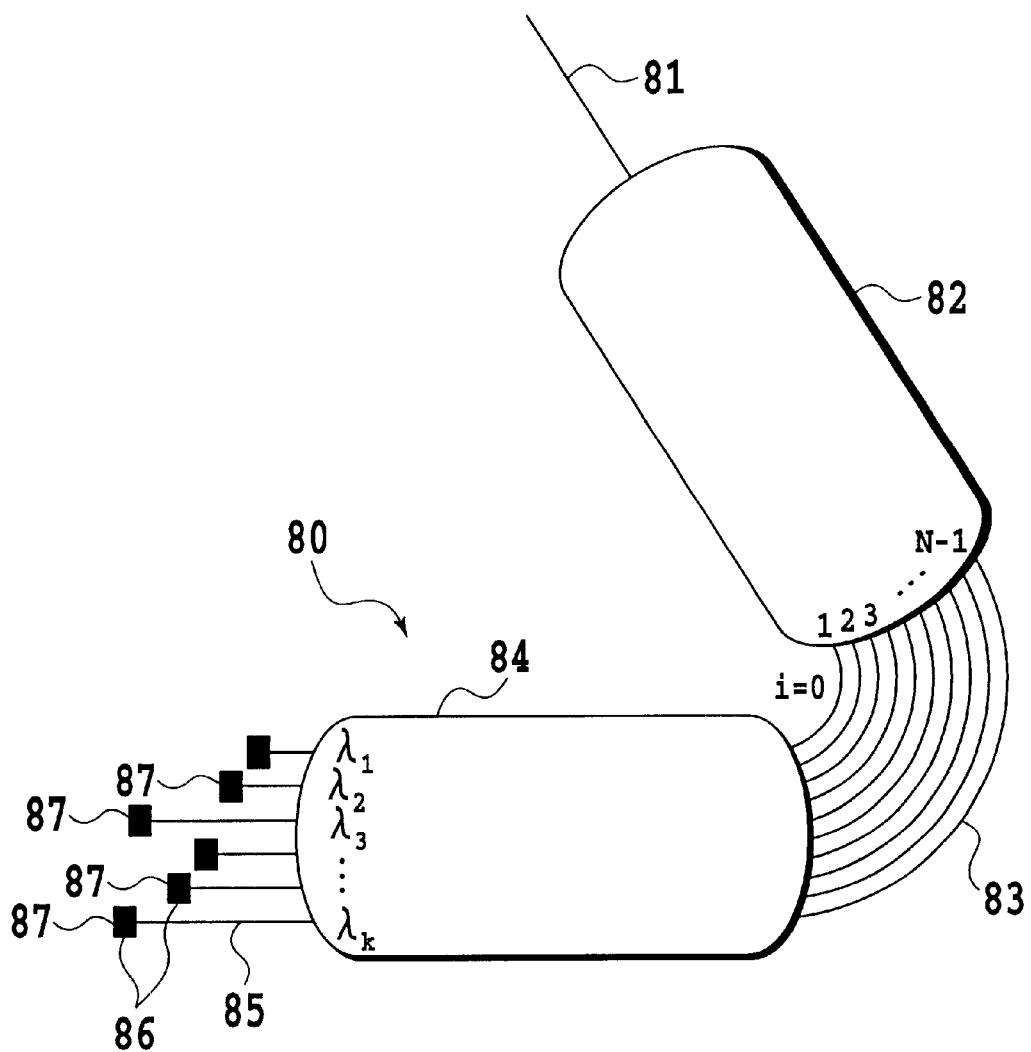
FIG. 9 is a schematic drawing illustrating the configuration of AWG of a third example of the invention that has discontinuous mapping characteristics.
Figure 10:
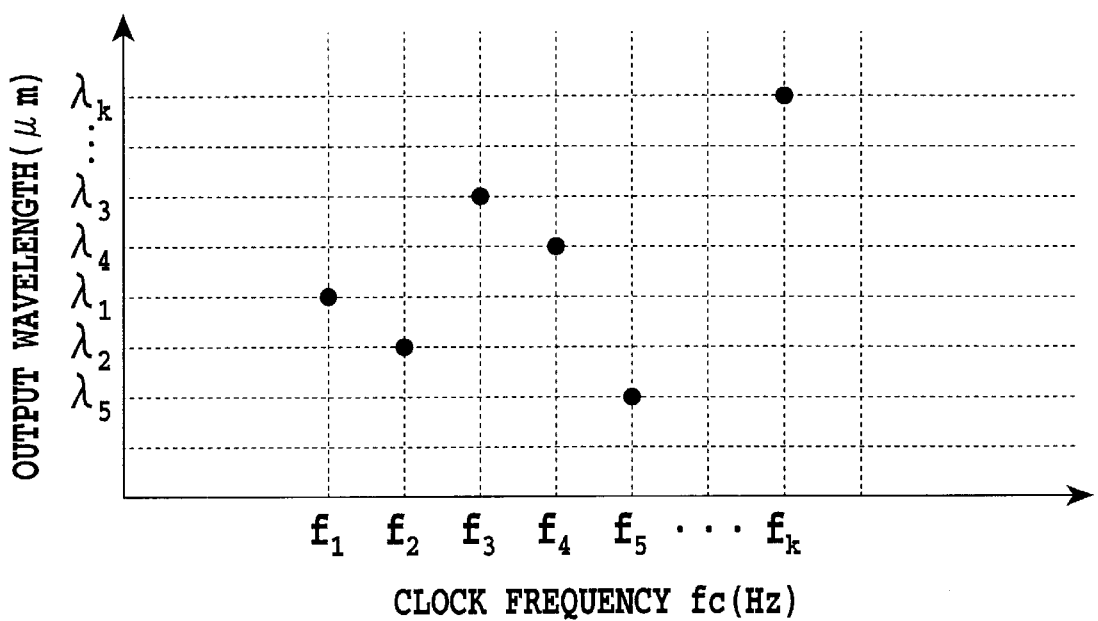
FIG. 10 is a graph showing changes in wavelength with regard to clock frequency (discontinuous mapping characteristics)

The light that has entered the input terminal 81 is guided to the arrayed waveguide 83 by the star coupler 82. The length L(i) of the arrayed waveguide 83 is defined as:

$$L(i)=L_o+\Delta L_1(i-N/2)+\Delta L_2(i-N/2)^2 \qquad (6),$$

where i is the label of a waveguide shown in FIG. 9 and N the number of waveguides.

The light beams emitted from the arrayed waveguide 83 interfere with each other in the star coupler 84 and light beams of different wavelengths are output to the emission end 85. When the reflection face 86 is inserted in the emission end 85, varying repetitions can be produced by changing its insertion length. Namely, the relation between wavelength and delay time can be controlled as desired.

As a method to provide the optimum values for $\Delta L_1$ and $\Delta L_2$, an example is shown below where the number of wavelengths is 32 and the wavelength interval is 0.8 nm ($SiO_2$ is used) for use in the 1.5 $\mu$m band.

First, an AWG 80 is designed to provide diffraction order m=n$\Delta L_1/\lambda_0$=59, $\Delta L_1$=63 $\mu$m, and $\Delta L_2$=0, where n=1.45 is an effective refractive index and $\lambda_0$=1550 nm the central wavelength. The value of N can be set at 200, for example.

A delay time is given as desired by controlling the length of the emission end. In the present circuit, however, the free spectrum range (FSR) of AWG 80 needs to be limited for stable oscillation. The magnitude of FSR can be estimated by the relation FSR$\approx \lambda_0$/m.

In the above example, if $\Delta L_2$=6/N=0.03 $\mu$m, FSR is sufficiently narrowed and a stable oscillation is realized. This circuit produces a discontinuous change in wavelength based on the clock frequency as shown in FIG. 10.

FOURTH EXAMPLE

Next, a fourth example of the invention is explained below with reference to FIGS. 11 and 12. Description of the like components referred to in the first to third examples is omitted and like components have like numbers.

This example shows another configuration for the wavelength mapped delay circuit 54.

The wavelength mapped delay circuit 54 is structured by using a wavelength dispersion medium in which a propagation delay has a characteristic of an increase or a decrease according to each wavelength. This circuit 54 is structured by an optical fiber having the wavelength dispersion medium providing a large wavelength dispersion or a Bragg grating (BG) having a continuous chirp (change in propagation delay depending on wavelength).

Figure 11:
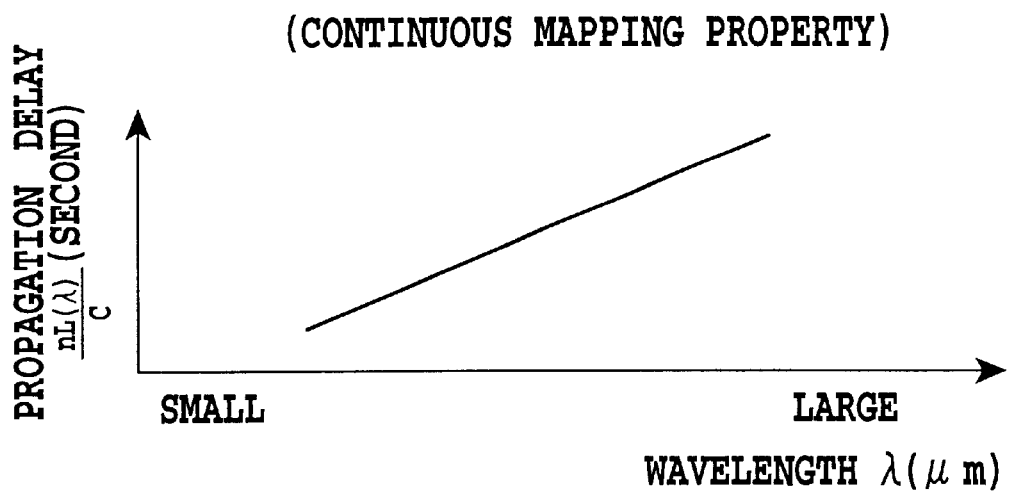
FIG. 11 is a schematic drawing illustrating the continuous mapping characteristics (namely, continuous change in delay with wavelength) of a wavelength mapped delay circuit made of a wavelength dispersion medium of a forth embodiment of the invention.
Figure 12:
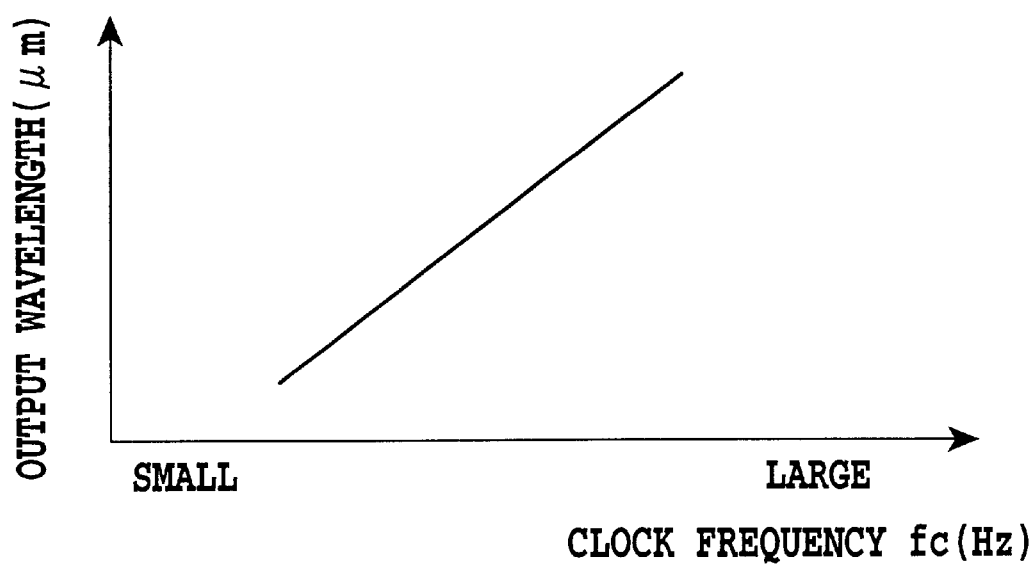
FIG. 12 is a schematic drawing illustrating the mapping characteristics (namely, continuous change in delay with clock frequency) of a wavelength mapped delay circuit made of a wavelength-dispersion medium.

This configuration provides a continuous change in propagation delay for each wavelength as shown in FIG. 11, and the change in wavelength also becomes continuous with regard to clock frequency as shown in FIG. 12.

The relation between wavelength dispersion D(ps/nm/km) and change in the effective length corresponding to optical path length $\Delta L_{eff}$ is expressed as below:

$$\Delta L_{eff} = cDL_D \Delta \lambda / n \qquad (7),$$

where $\Delta \lambda$ is the interval of wavelength and $L_D$ the length of the wavelength dispersion medium.

For example, a wavelength dispersion $DL_D$=6.25 ps/nm is required for $\Delta \lambda$=0.8 nm at $\Delta L_{eff}$=1 mm.

FIFTH EXAMPLE

Next, a fifth example of the invention is explained with reference to FIG. 13. Description of the like components referred to in the first to forth embodiments is omitted and like components have like numbers.

The mapping characteristics are fixed in the wavelength mapped delay circuit 54 of the aforementioned example, and fixed wavelengths and clock frequency mapping characteristics are provided.

In this example, the mapping characteristics become programmable (variable) when a variable delay device is inserted into the wavelength converter of the mode-locked laser equipment shown in FIGS. 1 and 8.

Figure 13:
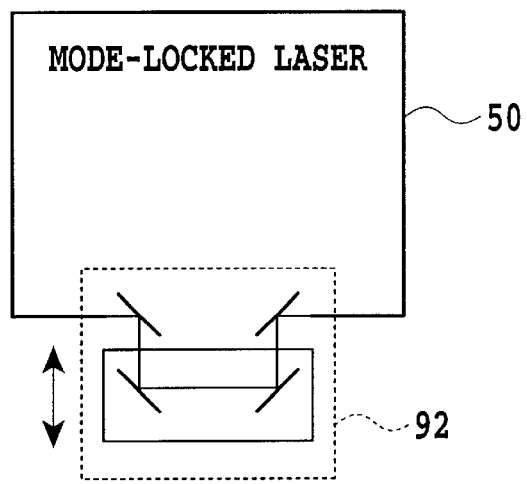
FIG. 13 is a block diagram illustrating the configuration of a programmable wavelength converter of a fifth example of the invention.

FIG. 13 shows a configuration of the mode-locked laser equipment where a variable delay device 92 is inserted into the wavelength-tunable light source 50.

The variable delay device 92 is a variable delay line comprising a movable stage, mirrors and lenses.

The variable delay device 92 can be inserted anywhere on the light path inside the wavelength-tunable light source 50 of FIG. 1. For example, it can be inserted in the light path between the optical modulator 51 and the optical amplifier 52 or between the optical direction-selective coupler 53 and the wavelength mapped delay circuit 54.

When the length of the resonator is changed by this variable delay device 92, the wavelength characteristics change accordingly over the axis of clock frequency.

SIXTH EXAMPLE

Next, a sixth example of the invention is explained with reference to FIG. 14. Description of the like components referred to in the first to fifth examples is omitted and like components have like numbers.

This embodiment describes another configuration of the delay circuit that provides programmable mapping characteristics.

Figure 14:
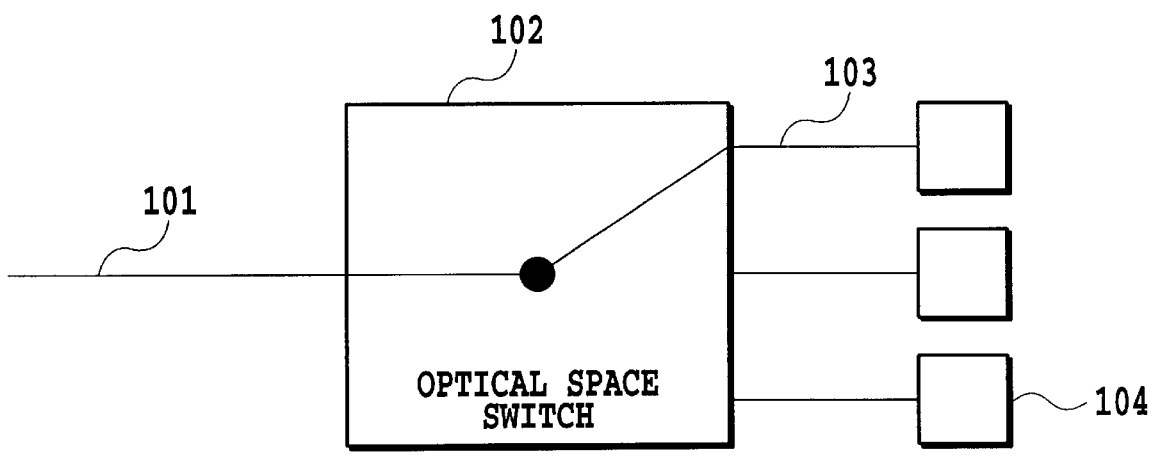
FIG. 14 is a block diagram illustrating the configuration of a programmable wavelength converter using a space switch of a sixth example of the invention.

Referring to FIG. 14, the circuit comprises an input and output terminal 101, a light space switch 102, the emission end 103 of the light space switch 102, and a plurality of wavelength mapped delay circuits 104 that are connected to the emission end 103 and provide many different wavelength-delay mapping characteristics.

The wavelength mapped delay circuit 104 corresponds to the wavelength mapped delay circuit 54 of FIG. 1. The light space switch 102 switches the wavelength mapped delay circuit 104.

The input light 101 is sent to one of the emission ends 103, controlled by the light space switch 102. Each emission end 103 is connected to the wavelength mapped delay circuit 104 that shows varying mapping characteristics. Therefore, by a selective operation of the light space switch 102, different mapping characteristics are presented for each wavelength mapped delay circuit.

SEVENTH EXAMPLE

Next, a seventh example of the invention is explained with reference to FIG. 15. Description of the like components referred to in the first to sixth examples is omitted and like components have like numbers.

This embodiment describes another configuration of the delay circuit that provides programmable mapping characteristics.

Figure 15:
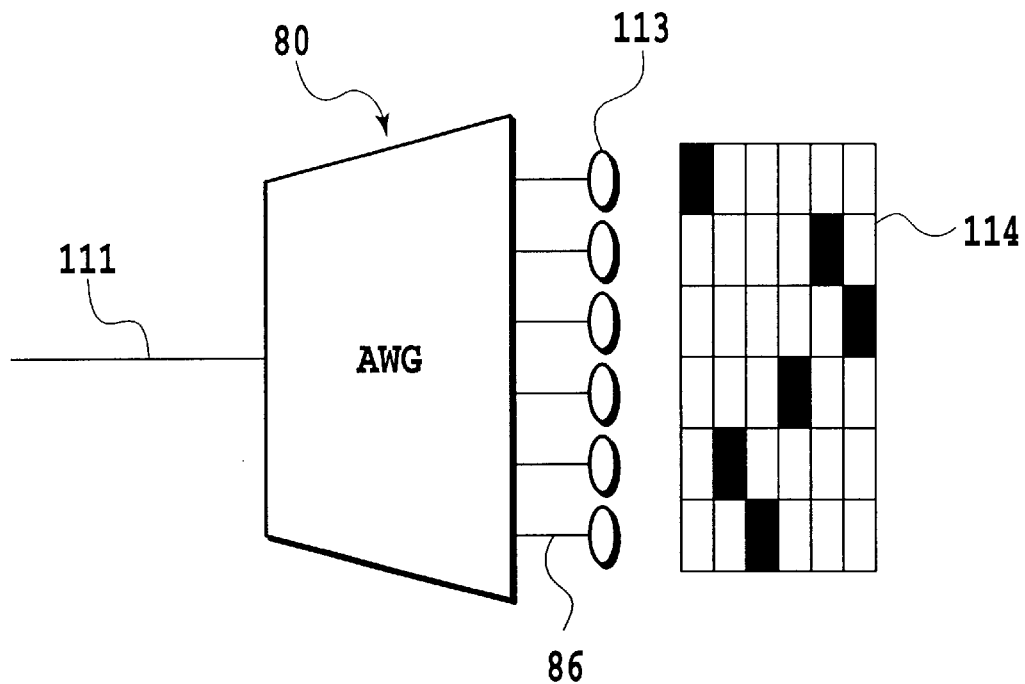
FIG. 15 is a block diagram illustrating the configuration of a programmable wavelength converter using a micro-opt-mechanical system mirror of a seventh example of the invention.

Referring to FIG. 15, the circuit is made of a combination of the aforementioned AWG 80 and a micro-opt-mechanical system (MEMS).

This circuit comprises an input and output terminal 111, AWG 80, lenses 113, and a programmable reflection mirror array 114 that is manufactured by micro-opt-mechanical system (MEMS) architecture. The component 86 is an output terminal of AWG 80 for wavelength separation.

MEMS mirrors are micro-mirrors of which angle and position can be controlled mechanically, driven by electric signals. The variable attenuator comprising MEMS mirrors and AWG 80 can provide a programmable wavelength mapped delay circuit.

In this circuit, light is guided to AWG 80 via input terminal 111. The structure of AWG 80 is the same as that described before. When the lengths of the emission ends 86 are all set equal and the light beams coming out from the emission ends 86 travel in space, they are converted to parallel beams by the lenses 113. If the output light travels in an optical waveguide, those lenses are not necessary.

The output light is entered into the reflection array 114 made by the MEMS technology. If the number of wavelengths is M, the array is formed to have M×K mirrors (K is an integer not smaller than M).

Assuming that each mirror has only two states, ON(black box) and OFF, light passes the mirror when the mirror is in OFF state. The positions of selected mirrors determine the amount of delay.

The light reflected by mirrors travels in AWG 80 in the opposite direction and goes out from the emission end 111.

Since the state of the mirror can be changed according to each wavelength as desired, arbitrary wavelength-delay characteristics are obtained.

EIGHTH EXAMPLE

Next, an eighth example of the invention is explained with reference to FIG. 16. Description of the like components referred to in the first to seventh examples is omitted and like components have like numbers.
(Wavelength Router)

This embodiment describes a configuration of the wavelength router of which output is connected to a wavelength separation/integration circuit.

Figure 16:
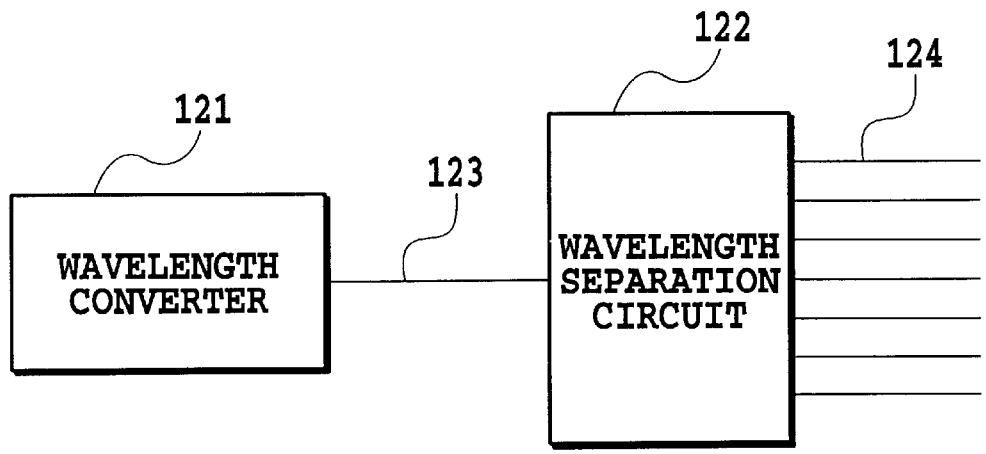
FIG. 16 is a block diagram illustrating the configuration of a wavelength converter and a router of an eighth example of the invention.

FIG. 16 shows an example of the configuration of the wavelength router. This circuit comprises, as in FIGS. 1 and 8, a wavelength converter 121, 1×K wavelength separation circuits 122, an input terminal 123 of wavelength separation circuits 122, and as many as K output terminals 124 of the wavelength separation circuits 122. As components to be mounted in these devices, AWG, bulk diffraction grating, and dielectric multi-layer filter can be used.

The light of which wavelength has been converted by the wavelength converter 121 is entered into the wavelength separation circuit 122. The wavelength separation circuit is a device having an input terminal 123 and as many as N output terminals 124. Corresponding to the wavelength of input light, an appropriate output terminal 124 is selected.

The transmission path can thus be switched by selecting the frequency of the clock signal.

NINTH EXAMPLE

Next, a ninth example of the invention is explained with reference to FIGS. 17–26. Description of the like components referred to in the aforementioned embodiments is omitted and like components have like numbers.

Time-to-wavelength mapped mode-locked laser is a light source in which oscillation wavelength becomes selective by means of applying a clock signal to the laser as an input signal and changing repetition frequency fi.

Figure 17:
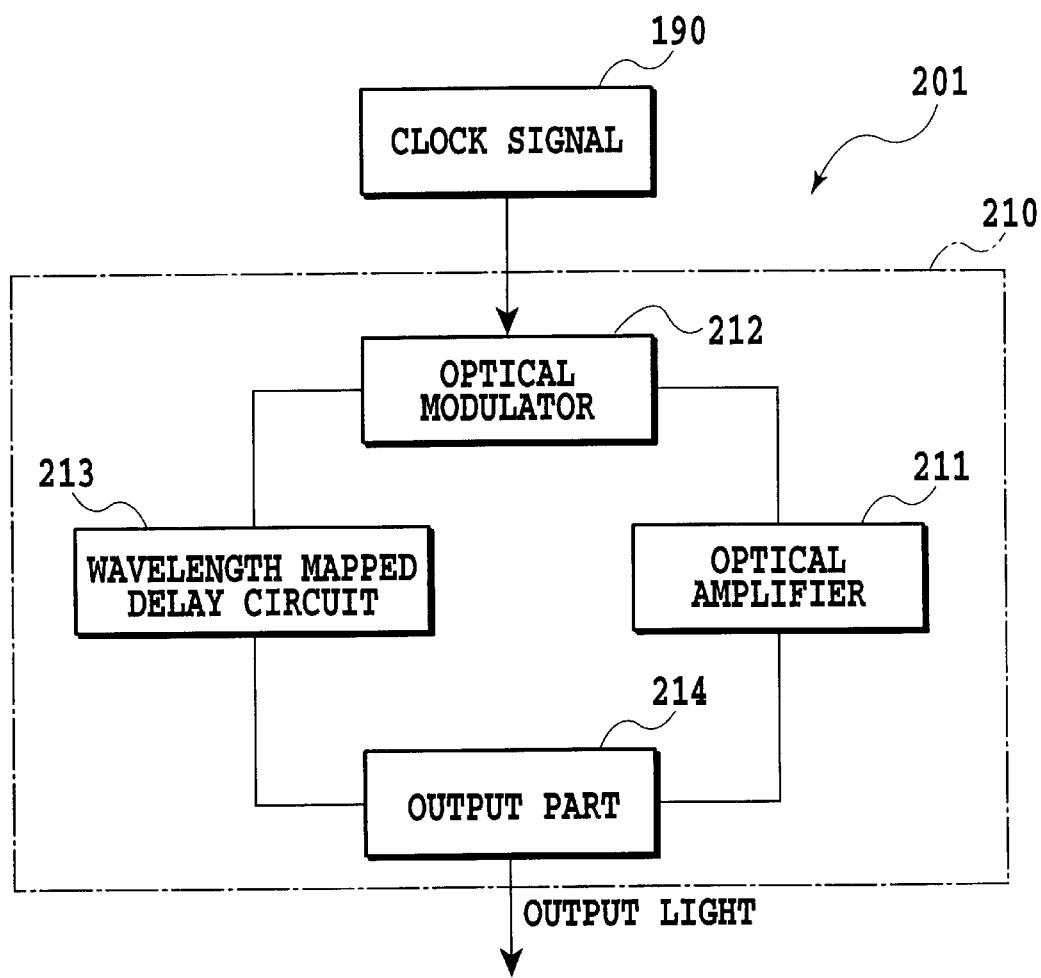
FIG. 17 is a block diagram illustrating the configuration of a time-to-wavelength mapped mode-locked laser of a ninth example of the invention.

FIG. 17 is an example of the configuration of a time-to-wavelength mapped mode-locked laser.

Referring to FIG. 17, the time-to-wavelength mapped mode-locked laser 201 comprises a clock signal generator 190 that generates a clock signal and a resonator 210. The resonator 210 comprises an optical amplifier 211, an optical modulator 212, a wavelength mapped delay circuit 213, and an output portion 214 that takes out laser as an output signal.

Figure 18:
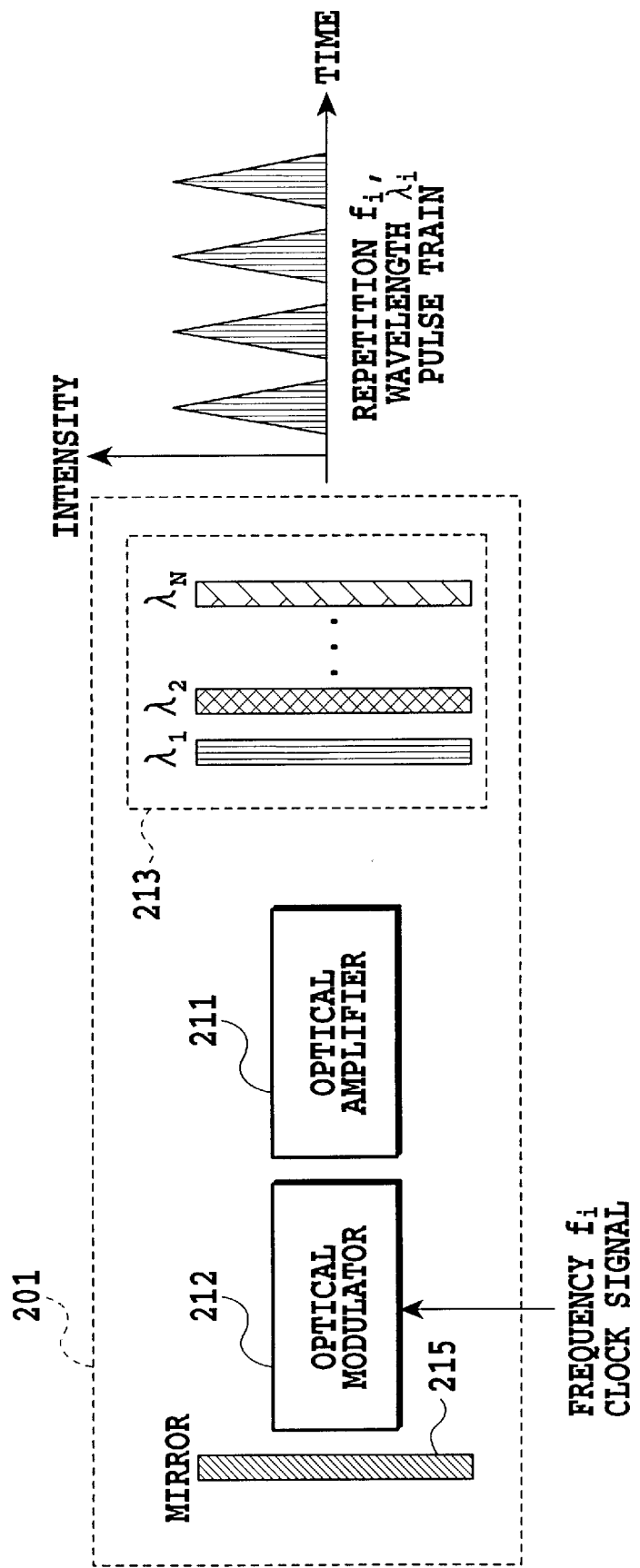
FIG. 18, a reference to FIG. 17, is a block diagram illustrating the configuration of a linear resonator using an reflector mirror.

FIG. 18, corresponding to FIG. 17, shows an example of the configuration of a linear resonator using a reflection mirror 215.

In FIG. 18, the wavelength mapped delay circuit 213 is a circuit that provides a different propagation delay (or the length of optical path) for each wavelength ($\lambda_1, \lambda_2 \ldots \lambda_N$). When it is inserted into the resonator 210, a different length of the resonator is provided for each wavelength.

(System Configuration)

Figure 19:
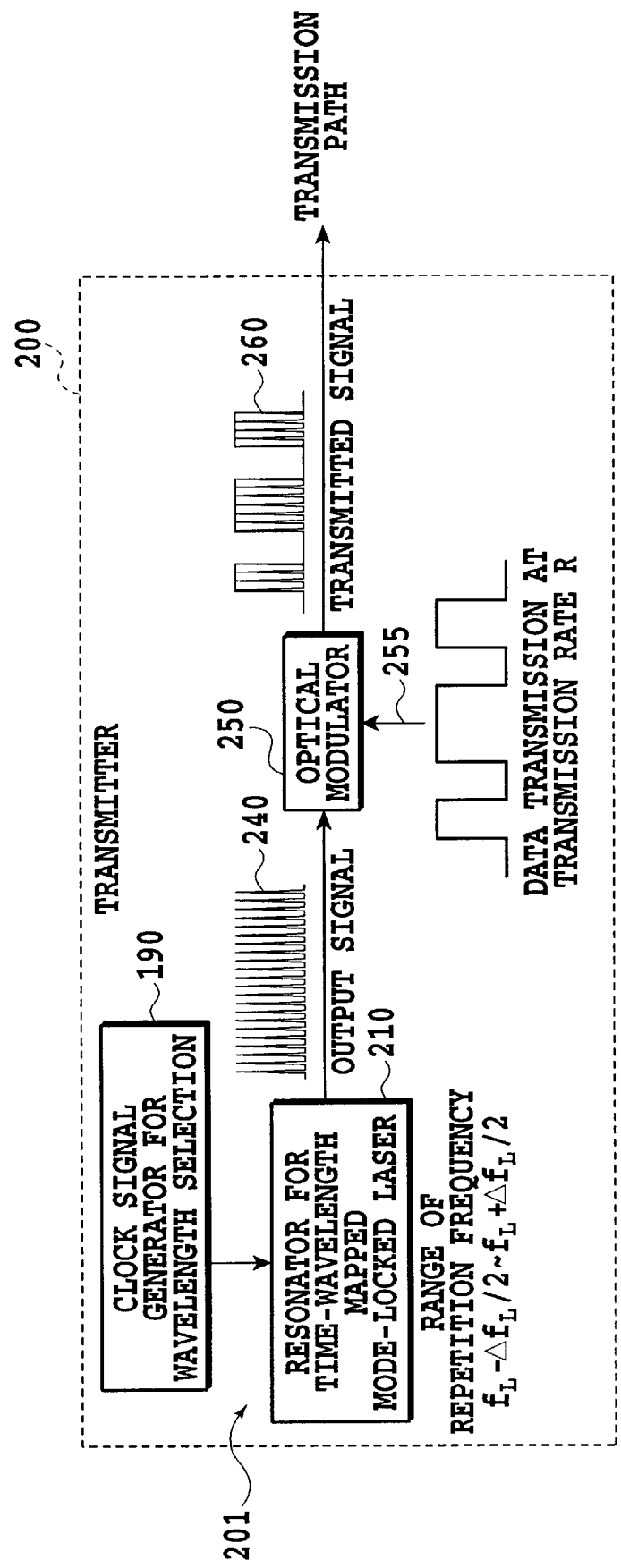
FIG. 19 is a block diagram illustrating the configuration of the transmitter in the transmission system of the invention.
Figure 20:
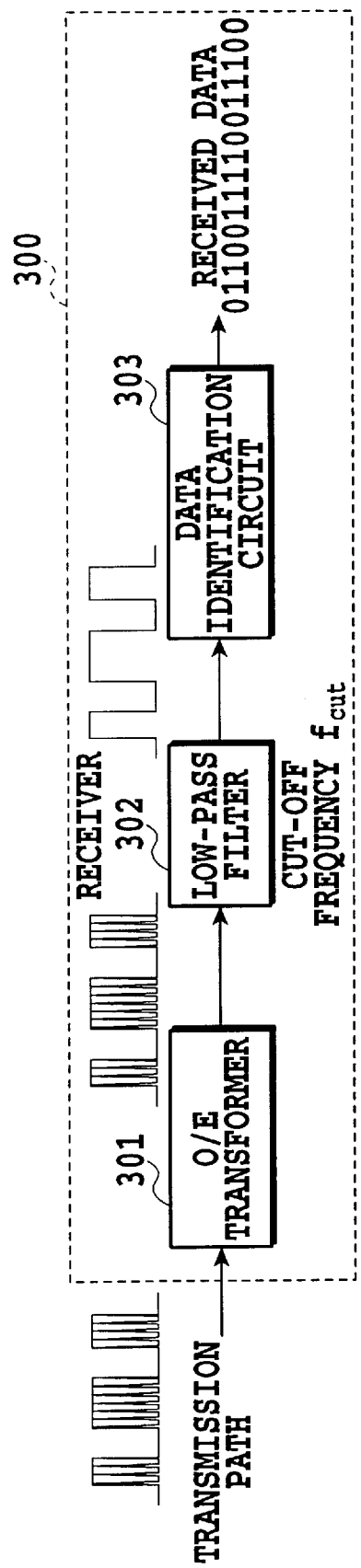
FIG. 20 is a block diagram illustrating the configuration of the receiver responding to the above transmitter in the transmission system of the invention.
Figure 21:
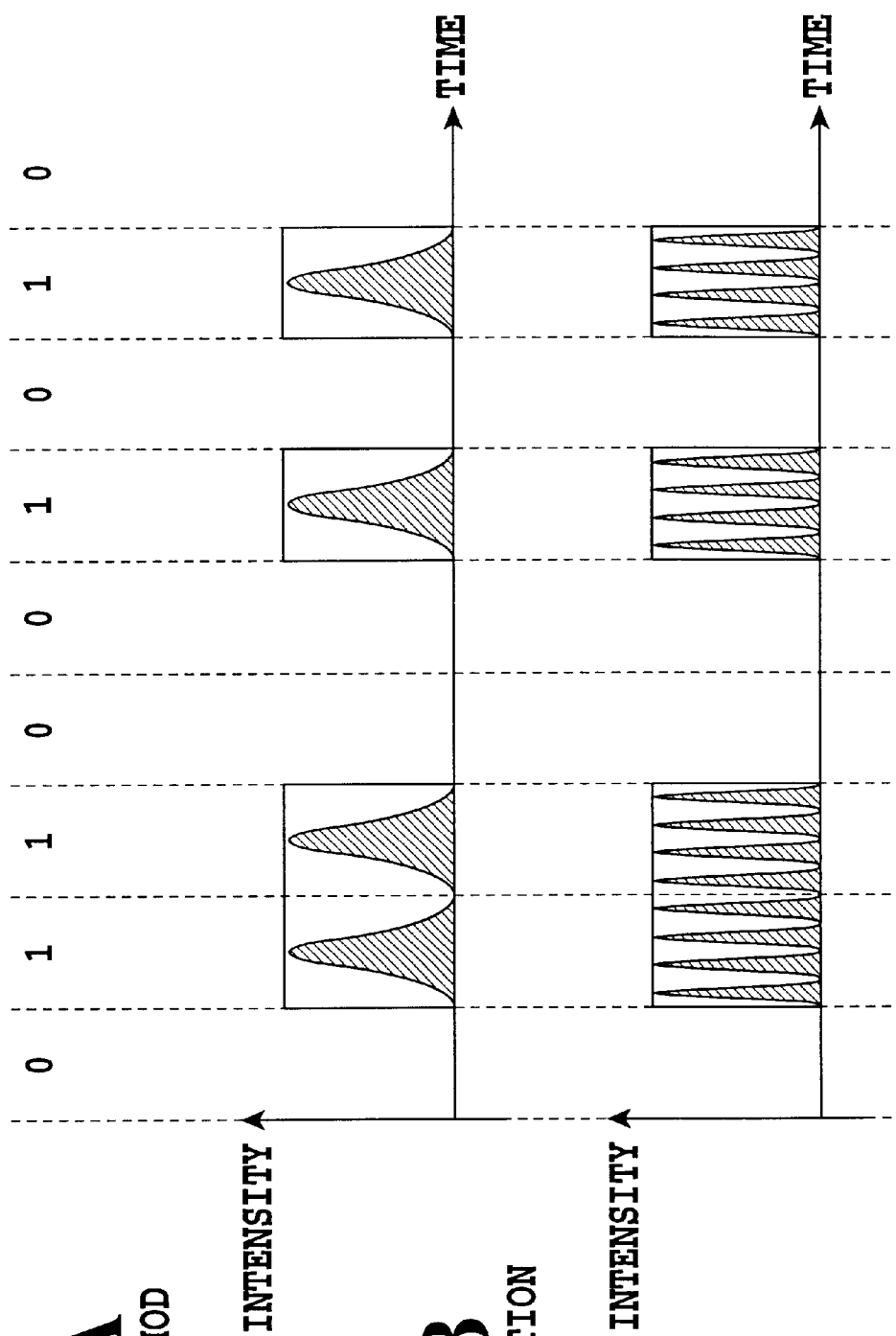
FIGS. 21A and 21B are illustrative drawings that compare the transmission method of the invention with that of prior art.

This transmission system comprises a transmitter 200 shown in FIG. 19 and a receiver 300 shown in FIG. 20.

(Transmitter)

FIG. 19 shows the configuration of the transmitter 200 that has the resonator 210 for the time-to-wavelength mapped mode-locked laser 201 of FIG. 17. In the transmitter 200 of FIG. 19, the output signal of time-to-wavelength mapped mode-locked laser 201 is entered into optical modulator 250 and modulated there by data signals of a transmission rate R.

The repetition frequency of the time-to-wavelength mapped mode-locked laser 201 changes according to oscillation frequency. In this embodiment, it is assumed that the repetition frequency has a bandwidth $\Delta f_L$ ($\Delta f_L \ll f_L$) around its center $f_L$.

In this invention, it is important that the transmission rate of the data signal applied to the optical modulator 250 is R and the relation $R \ll f_L$ is fulfilled. This transmission rate R does not agree with the repetition frequency $f_L$ of the time-to-wavelength mapped mode-locked laser 201. The data signal, however, is modulated as an envelope that changes its profile slowly, and the pulse train output from the time-to-wavelength mapped mode-locked laser 201 are modulated as pulse-type sub-carriers.

Now the operation of transmitter 200 is explained below in detail.

First, the configuration of the time-to-wavelength mapped mode-locked laser 201 is described. As optical amplifier 211, an optical semiconductor amplifier, amplifier using rare-earth-doped optical fiber, or amplifier using rare-earth-doped waveguide can be employed. The optical semiconductor amplifier is suitable for use in a fast wavelength-tunable light source because its gain saturates very fast.

As wavelength mapped delay circuit 213, a distributed Bragg grating, an arrayed waveguide, or a delay circuit made of a wavelength dispersion medium can be used.

As optical modulator 212, an electro-absorption modulator or a Lithium-Niobate Mach-Zehnder (LNMZ) modulator can be used.

When the modulation frequency is 1 GHz or lower, the optical semiconductor modulator can also be used as optical modulator 212 (by modulating the injection current). In this case, there is an advantage that the optical amplifier 211 and the optical modulator 212 can be integrated into one device.

The transmission system can be either a ring- or linear-type laser. Also in this case, a means to generate a clock signal for mode-locking is necessary.

(Operation of the System)

There are several coding methods that can be used to modulate data signals. In this embodiment, the binary digital modulation is assumed to have been employed. A modulator of the same type as the optical modulator 212 used in the aforementioned time-to-wavelength mapped mode-locked laser 201 can be used as optical modulator for data modulation.

In designing a system, the maximum transmission rate $R_{Max}$ is determined beforehand, so that the minimum frequency $f_{Min}$ of the clock signal driving the time-to-wavelength mapped mode-locked laser is set to meet the condition $f_{Min} = f_L - \Delta f_L/2 \gg R_{Max}$.

In an ideal system, the relation $f_{min} > R_{Max}$ provides error-free communications. However, in real systems, it is necessary that $f_{Min} > 2 - 4 R_{Max}$. For example, if $R_{Max} = 2.5$ Gbps, $f_{Min} > 5 - 10$ GHz is required.

The transmitted signal thus propagates in the transmission path and enters a receiver 300 shown in FIG. 20. This transmission path includes not only an optical fiber, space, an optical communication network but also nodes utilizing a wavelength routing.

(Receiver)

FIG. 20 shows the configuration of the receiver 300 of this communication system. Optical signals sent from the transmitter 200 shown in FIG. 19 are converted into electric signals by an O/E converter 301. This converted electric signal has a sub-carrier modulation component and an envelope component as is the case with optical signals. This electric signal is entered into a low-pass filter 302.

In the low-pass filter 302, the sub-carrier component is removed based on a cut-off frequency of -3 dB in the range $R_{max} < f_{cut} < f_{Min}$ and the envelope component survives with no degradation during passing through the filter. A data identification circuit 303 identifies the envelope component to decode the transmission data.

FIGS. 21A and 21B show an example of transmitted signals in the communications system shown in FIGS. 19 and 20 in comparison with those in the prior art system. This example shows binary digital data with a pattern of 01011010.

In FIG. 21A showing the signal transmitted by the prior art method, the relation transmission rate $R=f_L$ is satisfied, and a light pulse corresponds to a data bit in a one-to-one relationship.

In FIG. 21B showing the signal transmitted by the method of the present invention, one bit corresponds to a plurality of pulse. In addition, the number of pulses that correspond to a data bit is not necessary to be an integer. The envelope component of the signal corresponds to the transmission data, and the data pattern can be decoded by extracting the envelope component.

Namely, in the method according to the present invention, an output signal 240 (i.e. a repetition frequency $f_L$) having an oscillation wavelength which has an arbitrary interval independent of the wavelength of the clock signal and a different propagation delay for each wavelength can be produced. The generated output signal 240 is modulated by the optical modulator 250 (see FIG. 19) based on the data signal 255 of a transmission rate $R(\ll f_L)$, and the transmission signal 260 is produced for transmission.

On the other hand, the receiver extracts only the envelope component by passing the transmission signal 260 through the low-pass filter 202 that has a predetermined cut-off frequency $f_{cut}$, and thereby decoding the data pattern.

In the present invention, transmission information is added to the envelope component of the transmission signal 260, with the repetition frequency $f_L$ of the time-to-wavelength mapped mode-locked laser 201 being set at a value much higher than the transmission rate R, and then the envelope component is decoded for data reception. Then the repetition frequency $f_L$ of laser does not have to agree with the transmission rate R.

(Example of System Design)

Next, an example of the design of the present transmission system is explained with reference to FIGS. 22–26.

(Transmitter)

Figure 22:
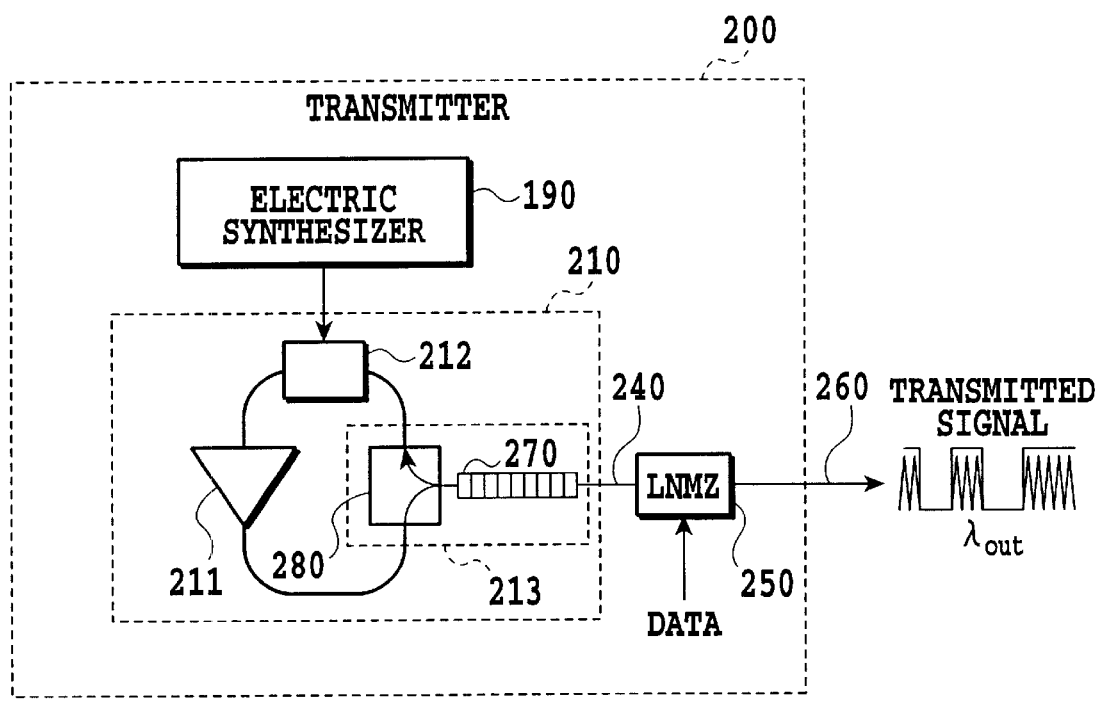
FIG. 22 is a block diagram illustrating a representative design of the transmitter in the transmission system for the laser of FIG. 17.

FIG. 22 shows an example of the time-to-wavelength mapped mode-locked laser 201 connected to a network management system 160.

Figure 23:
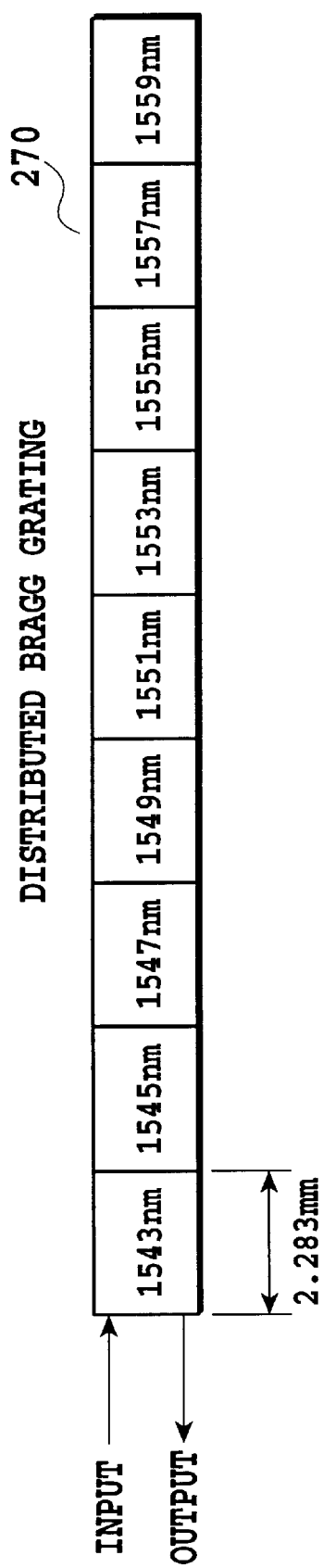
FIG. 23 is an illustrative drawing that shows an example of the settings of distributed Bragg gratings.

The time-to-wavelength mapped mode-locked laser 201 is structured by fiber Bragg gratings 270 of nine wavelengths as depicted in FIG. 23. The numbers in FIG. 22 correspond to those in FIG. 17.

In this network management system 160, after a frequency adjustment for a desired frequency in a frequency adjusting unit 170, the frequency of the clock signal produced by an electric synthesizer 190 is determined by a frequency setting device 180, and the clock signal is entered to a clock signal generator 190 of the time-to-wavelength mapped mode-locked laser 201.

The clock signal generator 190 produces a clock signal for wavelength selection by the use of the electric synthesizer. In this case, a laser frequency is selected by setting a frequency in the electric synthesizer. The generated clock signal is entered to an optical modulator 212.

The optical modulator 212 is a Lithium-Niobate Mach-Zehnder (LNMZ) type modulator and the optical amplifier 211 is an optical semiconductor amplifier. Since the present laser system employs a ring system, an optical circulator 280 with nine wavelengths and an optical fiber distribution Bragg gratings 270 can be employed in the resonator 212. The optical fiber distribution Bragg grating 270 and the optical circulator 280 comprise the time-to-wavelength mapped mode-locked laser.

The light that has passed through the optical fiber distribution Bragg gratings becomes an output light, namely, the output signal 240.

FIG. 23 shows a configuration of optical fiber distribution Bragg gratings, where the distribution Bragg gratings are arranged in an increasing order of wavelength in a wavelength range from 1543–1559 nm at a wavelength interval of 2 nm.

Figure 24:
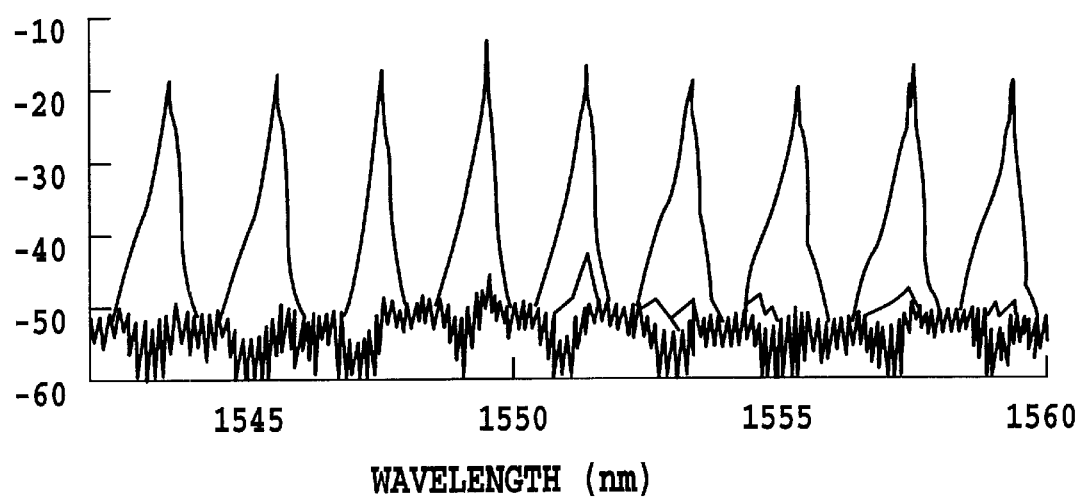
FIG. 24 is a graph illustrating a spectrum of nine-wavelength oscillation.
Figure 25:
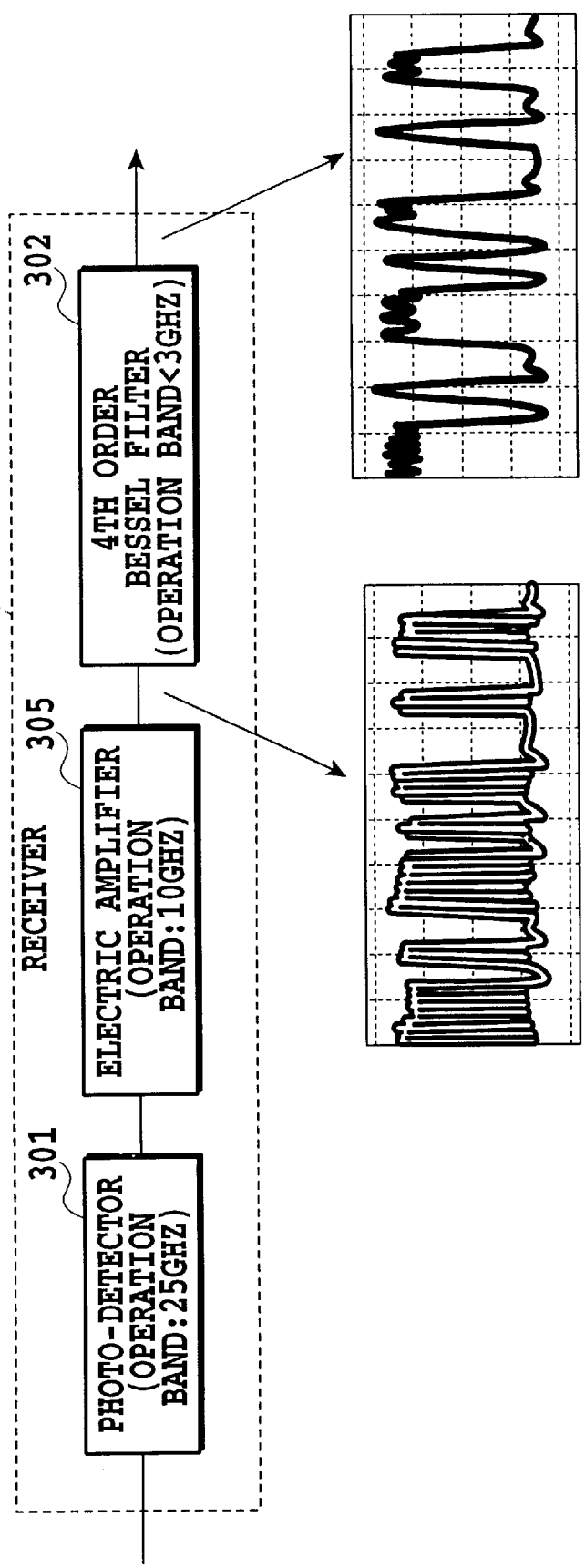
FIG. 25A is a block diagram illustrating an example of the design of the receiver of the transmission system.
FIG. 25B and FIG. 25C show the waveform of signals presented before/after passing a low-pass filter.

FIG. 24 shows an example of a spectrum in the case of an oscillation with nine wavelengths, where the repetition frequency of laser is 10 GHz.
(Receiver)

FIGS. 25A, 25B and 25C show examples of configuration of the receiver. The numbers in FIG. 25A correspond to those in FIG. 20.

In FIG. 25A, the O/E converter 301 is made of a 25 GHz photo-detector. The output from this photo-detector is amplified by a 10 GHz electric amplifier 305. By passing the output light from an electric amplifier 305 through a low-pass filter 302, which is a 4th Bessel filter of $f_{cut}$<3 GHz, the envelope component in the data signal can be decoded.

The waveforms shown in FIGS. 25B and 25C are those presented before and after the decoding of the envelope component in the low-pass filter 302.

Figure 26:
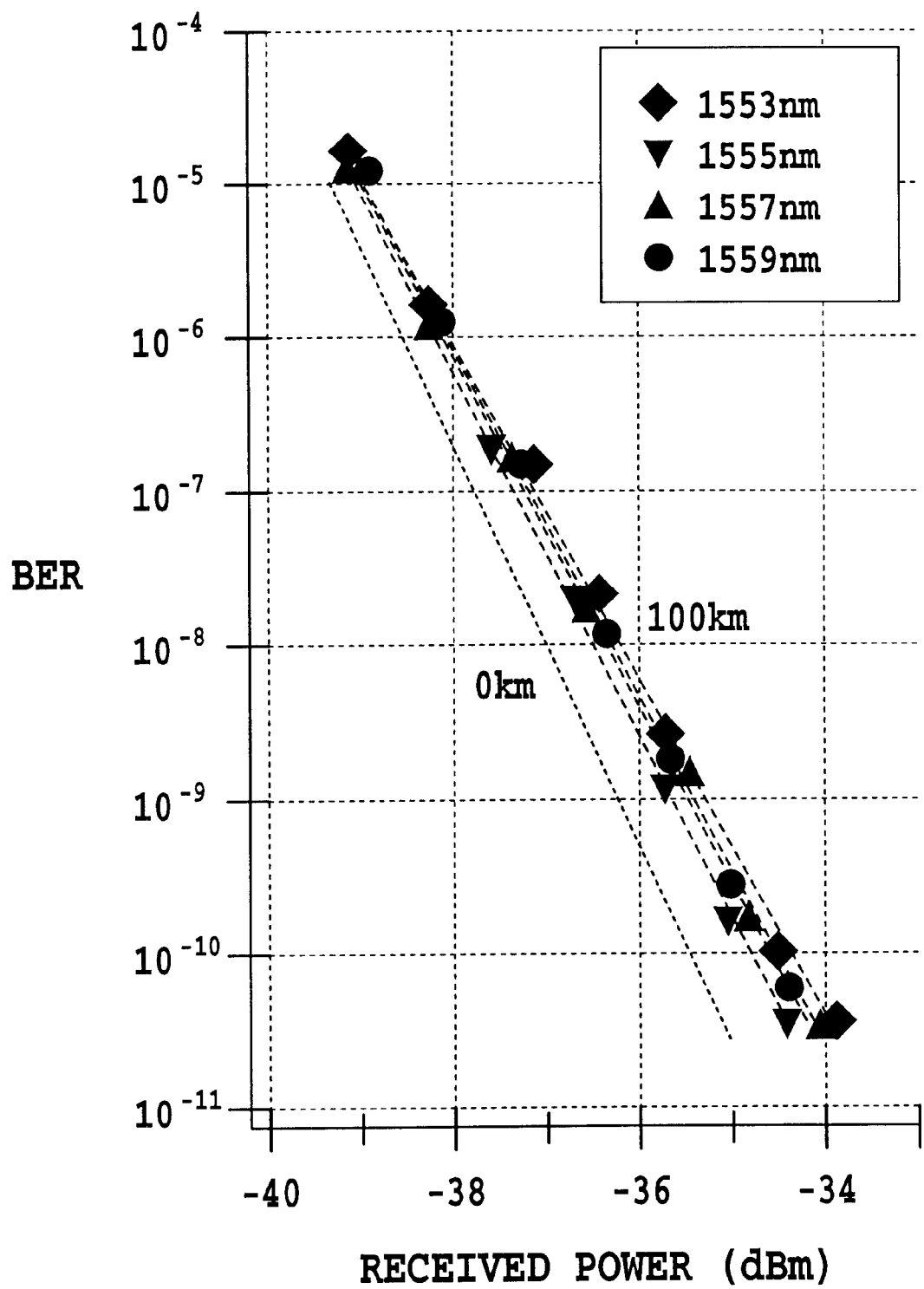
FIG. 26 is a graph illustrating the results of a transmission test using an optical fiber.

FIG. 26 shows the experimental results when a transmission test was conducted with a 100 km optical fiber with laser of wavelengths 1553 nm, 1555 nm and 1559 nm. This figure indicates that an error-free operation was realized. In FIG. 26, the horizontal axis is received power (dBm) and the vertical axis is BER.

TENTH EXAMPLE

Next, a tenth example of the invention is explained with reference to FIGS. 27–30.
(Time-to-wavelength Mapped Mode-locked Laser)

Figure 27:
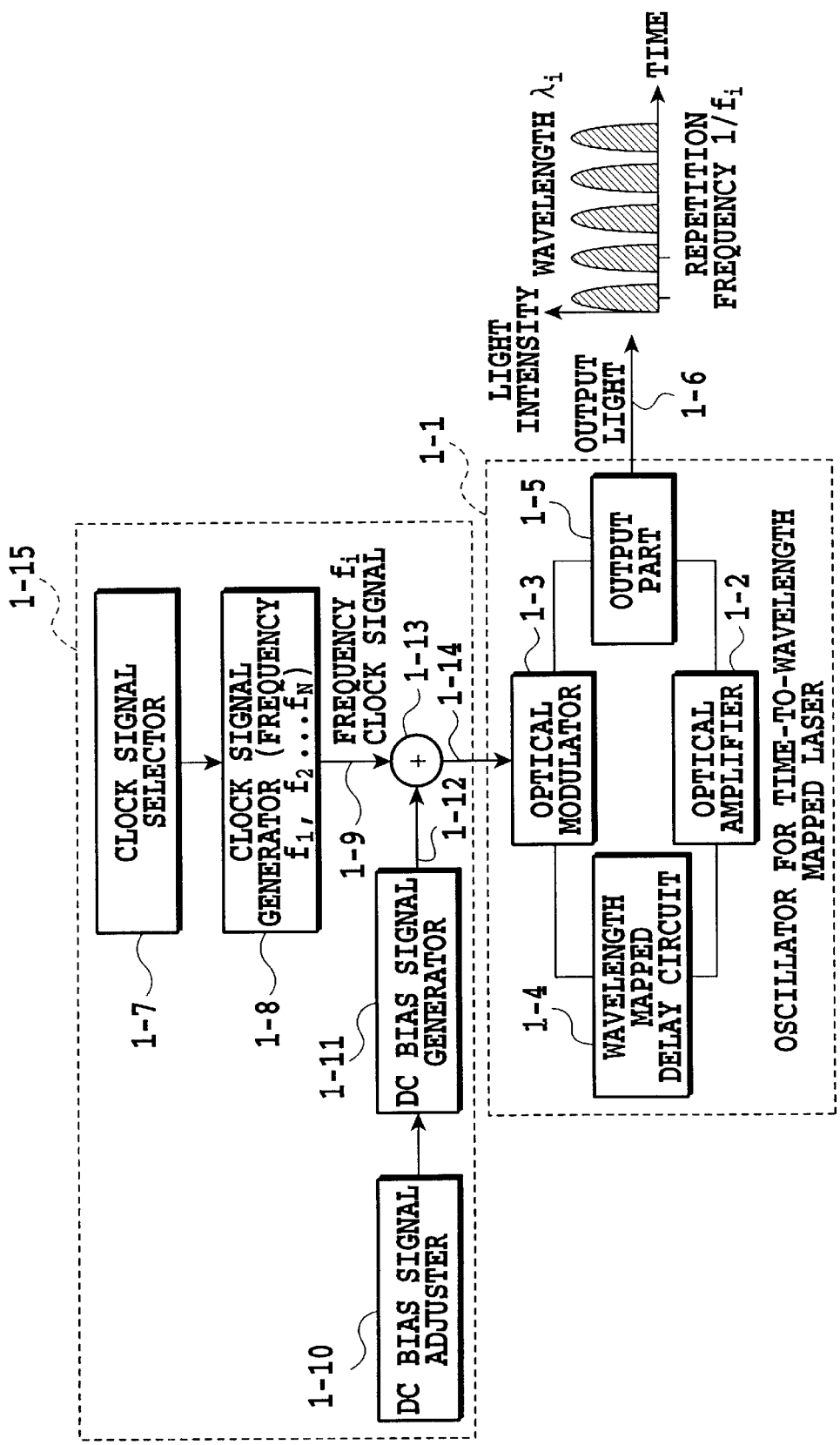
FIG. 27 is a block diagram illustrating the configuration of the time-to-wavelength mapped mode-locked laser of a tenth example of the invention.

FIG. 27 is an example of the configuration of time-to-wavelength mapped mode-locked laser. In FIG. 27, the time-to-wavelength mapped mode-locked laser comprises a driver 1-15 and a resonator 1-1.
(Resonator)

The structure of the resonator 1-1 is explained as follows.

Resonator 1-1 comprises an optical amplifier 1-2, an optical modulator 1-3, a wavelength mapped delay circuit 1-4, and an output part 1-5 extracting output light.

As optical amplifier 1-2, an optical semiconductor amplifier or a rare-earth-doped glass waveguide can be used. In the optical semiconductor amplifier, a fast wavelength tuning can be performed because of a high speed in gain saturation time.

As optical modulator 1-3, a lithium-niobate Mach-Zehnder (LNMZ) modulator an electro-absorption(EA) modulator can be used, for example.

When the repetition frequency is low (for example, less than 5 GHz), the function of optical modulator 1-3 can be realized by modulating the injection current put in the semiconductor amplifier. In this case, there is an advantage that the optical amplifier 1-2 and the optical modulator 1-3 can be integrated into one device.

In the output part 1-5, the light passing through a reflector used in the resonator 1-2 or the direction-selective optical coupler, for example, can be used.
(Driver)

Now the structure of the driver 1-15 is explained. The electric RF oscillator, for example, can be used as clock signal selector 1-7 and clock signal generator 1-8. For coupling components used in the resonator 1-1 optical waveguides can be used.

The optical waveguide is, for example, an optical fiber, waveguide on a glass substrate, or waveguide on a semiconductor substrate. Use of a glass or semiconductor substrate makes it easy to provide integrated time-to-wavelength mapped laser.
(Wavelength Mapped Delay Circuit)

Figure 28:
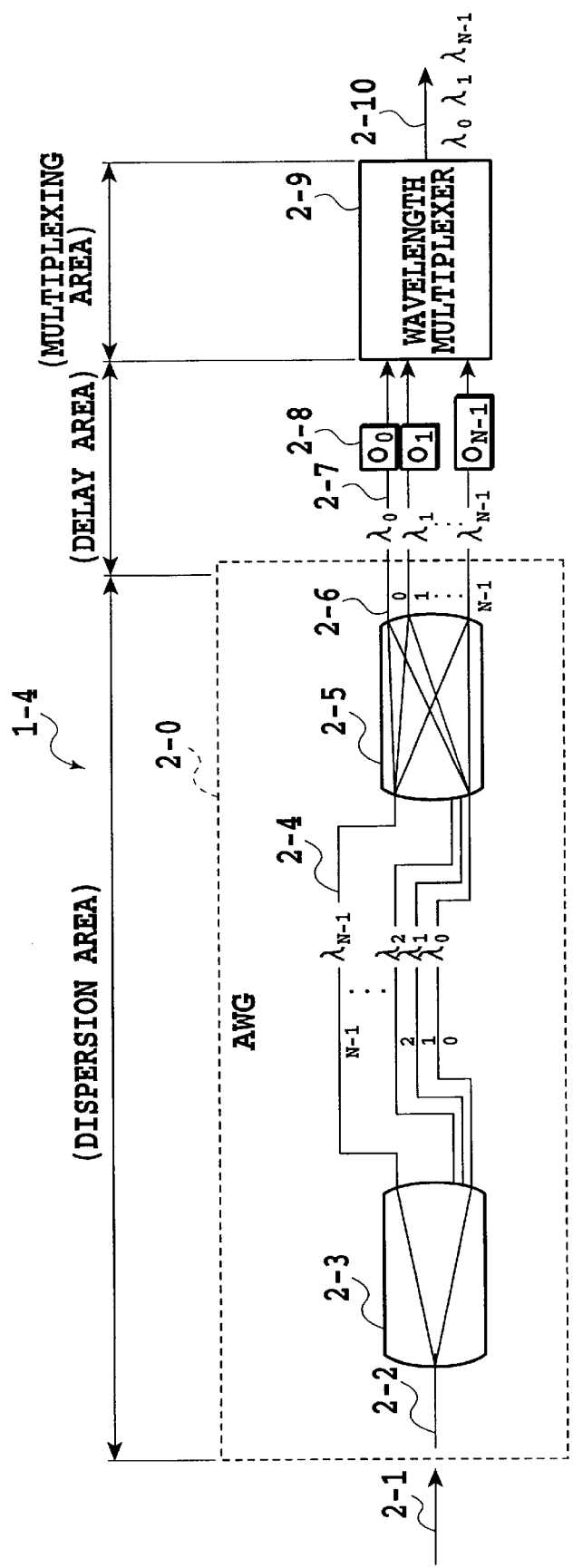
FIG. 28 is a block diagram illustrating the configuration of the wavelength mapped delay circuit.

FIG. 28 shows an example of the configuration of the wavelength mapped delay circuit 1-4 that employs an N-wavelength arrayed-waveguide gratings multiplexer (AWG) 2.0.

The light 2-1 entered into an input waveguide 2-2 is then entered to a waveguide array 2-4 via a star coupler 2-3. The waveguide array 2-4 is structured by M waveguides. The length of a waveguide is $\Lambda_i$ and there is a difference in length, $\delta\Lambda_{ij}$, in neighboring waveguides i and j.

On the output of the waveguide array 2-4, there is a star coupler 2-5 and the light beams emitted from the waveguide array interfere with each other in the star coupler 2-5 and then dispersed spatially. There are N waveguides 2-6 on the output side of the start coupler 2.5, where the beam of a wavelength $\lambda_k$ is entered into waveguide k based on the spatial dispersion.

The light beam 2-7 separated from N waveguides 2-6, and the beam of each wavelength is given a different propagation delay $D_i$ 2-8. Each delayed light beam is multiplexed by a wavelength multiplexer 2-9 and output light 2-10 is emitted from the output terminal. These are the operations performed in this wavelength mapped delay circuit 1-4.
(Another Wavelength Mapped Delay Circuit)

Figure 29:
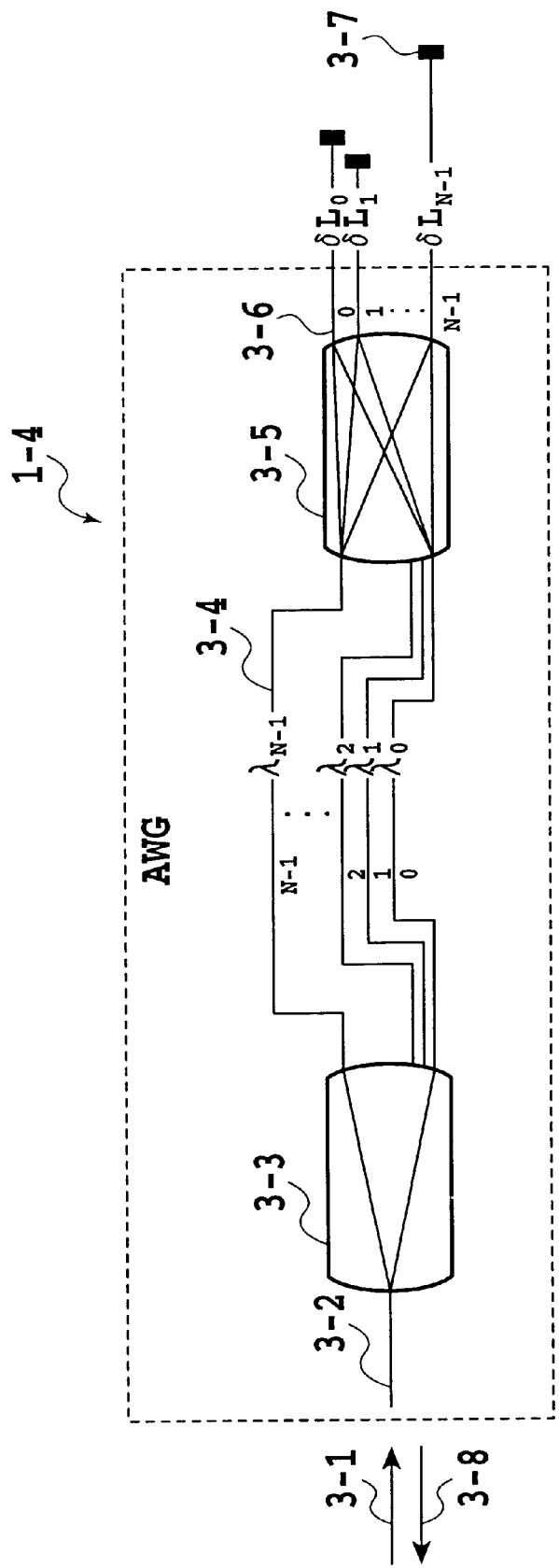
FIG. 29 is a block diagram illustrating the configuration of another wavelength mapped delay circuit that provides varying propagation delays.
Figure 30:
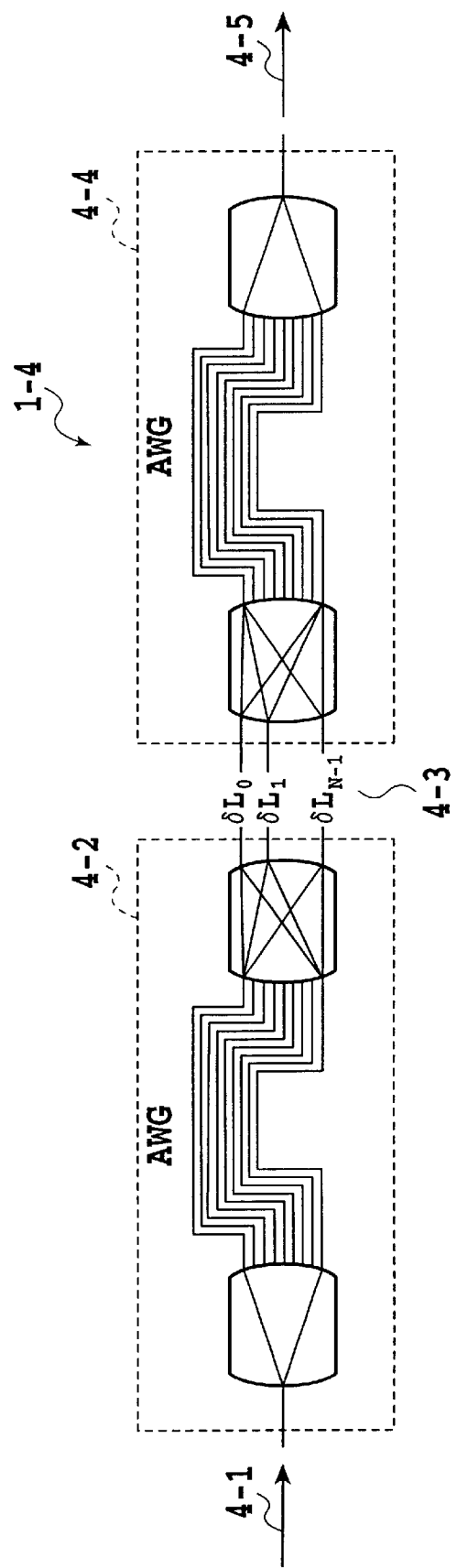
FIG. 30 is a block diagram illustrating the configuration of another wavelength mapped delay circuit that provides varying propagation delays.

FIG. 29 or FIG. 30 shows an example of the configuration of a wavelength mapped delay circuit 1-4 using AWG 2-0. In the configuration shown in FIG. 29, reflection mirrors 3-7 are inserted at the terminals of the N waveguides 3-6. The light beams entered N waveguides 3-6 are reflected by the mirrors and are transmitted in AWG 2-0 in the reverse direction. The output light 3-8 is output from the waveguide 3-2 in the opposite direction of the input light 3-1.

The difference in length in N waveguides 3-6 causes a different propagation delay $D_i=2n\delta L_i$ (n: refractive index, c: light speed) for each wavelength, and thereby the function of wavelength mapped delay circuit 1-4 is realized. This circuit can thus provide varying propagation delays to light of each wavelength.

FIG. 30 shows an example of another configuration that provides propagation delay. In FIG. 30, two AWGs of AWG 4-2 and AWG 4-4 are used. AWG 4-2 splits the input light 4-1 into as many as N waveguides based on wavelength. The split light beams are multiplexed by AWG 4-4 with regard to wavelength and the output light 4-5 is provided.

Different propagation delay $D_i=n\delta L_i/c$ is given to each beam of different wavelength by making the length $\delta L_i$ of each waveguide 4-3 different from each other. The wavelength mapped delay circuit 1-4 is thereby prepared.

(Example of Design)

Now the designing method for normal operation of the time-to-wavelength mapped laser is explained with reference to FIG. 27. In FIG. 27, the overall optical path length in the resonator can be expressed by $L_{opt}(\lambda_i)$. The optical path length of the resonator 1-1 is an integral of the product $n_a L_a$ of refractive index $n_a$ and the length $L_a$ of each component of resonator 1-1 where the dependence on wavelength is expressed by $\delta L_i$.

The relation between primary repetition frequency of laser $f(\lambda_i)$ and $L_{opt}(\lambda_i)$ is expressed by $f(\lambda_i)=c/L_{opt}(\lambda_i)$, where c is the speed of light. When laser is modulated by optical modulator 1-3 with a clock signal of a frequency $f(\lambda_i)$ or $mf(\lambda_i)$ (m: positive integer), the pulse train of a wavelength $\lambda_i$ and a repetition frequency $f(\lambda_i)$ are produced, with the laser being mode-locked, and they are output from the output part 1-5. The value of m represents a harmonic order, where m=1 implies the fundamental mode-locking and m>1 harmonic mode-locking.

In designing $L_{opt}(\lambda_i)$, it is necessary to prevent simultaneous oscillation at more than one wavelength for one clock signal frequency $f_i$. One of the requirements for the design to prevent simultaneous oscillation is mentioned below.

First, it should be noted that the properties of AWG 2-0 change at a certain periodicity in its wavelength range. This interval is equal to the free spectral range (FSR) of AWG 2-0, FSR~$\lambda_o/P$, where P is the diffraction order of AWG 2-0. If $\delta\Lambda_{ij}$ is constant (namely, expressed by $\delta\delta$ independently of i and j), P is equal to $n\delta\Lambda/\lambda_o$, where n is refractive index.

On of the methods to prevent simultaneous oscillation at more than one frequency is to make FSR larger than the amplification band of the optical amplifier that is used for the laser equipment. In this case, oscillation only takes place in the frequencies within the gain band of laser.

Another method is to chirp $\delta\Lambda_{ij}$ (C. R. Doerr, M. Zirngibl, C. H. Joyner, Chirping of the Waveguide Grating Router for Free-Spectral-Range Mode Selection in the Multifrequency Laser IEEE Photon. Technol. Lett., vol.8, pp.500–502, April 1996).

The term "chirping" implies that $\delta\Lambda_{ij}$ is not constant and gradually increases or decreases depending on the value of i.

In this way, the frequency band where AWG 2-0 operates at a small loss can be restricted to one and the loss in neighboring frequency bands becomes large. In the band where energy loss is large, laser oscillation does not occur, thereby suppressing simultaneous oscillation for each frequency band.

Next, a method to prevent simultaneous oscillation at more than one frequency in the same band is explained below.

First, $L_{opt}(\lambda_i) \neq L_{opt}(\lambda_j)(i \neq j)$ is a necessary condition. Namely, the length of the resonator for each wavelength needs to be different from each other. Therefore, the wavelength mapped delay circuit 1-4 is designed to provide the relation $L_{opt}(\lambda_i) \neq L_{opt}(\lambda_j)(i \neq j)$.

This limitation alone, however, could allow simultaneous oscillation at more than one frequency at varying harmonic orders. To prevent this simultaneous oscillation, the following conditions should be taken into account, assuming that the shortest value of $L_{opt}(\lambda_i)$ is $L_{opt}(min)$ and the longest $L_{opt}(max)$.

The primary repetition frequencies for $L_{opt}(min)$ and $L_{opt}(max)$ are $f(min)=c/L_{opt}(min)$ and $f(max)=c/L_{opt}(max)$. Since $L_{opt}(min)<L_{opt}(max)$, $f(min)>f(max)$. When laser is operated at a harmonic order $m_0$ for mode-locked oscillation, simultaneous oscillation at different harmonic orders is prevented by meeting the two requirements that $(m_o+1)f(max)>m_o f(min)$ and $(m_o-1)f(min)<m_o f(max)$ at the same time.

For example, assume a laser that operates at a harmonic order m=10 with a central repetition frequency=10 GHz on a quartz-glass substrate.

Then the interval that corresponds to the central repetition frequency becomes loops and this translates into a propagation length of 3 cm in vacuum. The length for a round trip in vacuum in the resonator becomes m×3=30 cm when m=10. If the refractive index of quartz glass is 1.45, the length of 30 cm in vacuum translates into a physical length of about 20.69 cm in quartz.

Further, if a linear-type resonator is used, the physical length that laser runs to make a round trip in the resonator 1-1 becomes half the above value, 10.34 cm. For this type of laser, a wavelength mapped delay circuit 1-4 shown in FIG. 30 will be suitable.

The wavelength mapped delay circuit 1-4 can be considered to cause a change of $\pm\delta L$ in the optical path length in the resonator 1-1 around the central value 30 cm obtained in vacuum.

In this case, $L_{opt}(max)=30$ cm+$\delta L$ and $L_{opt}(min)=30$ cm$-\delta L$. Following the above consideration, $11/L_{opt}(max)>10/L_{opt}(min)$ and $10/L_{opt}(max)>9L_{opt}(min)$ have to be fulfilled, and then $\delta L<30/21=1.43$ cm.

This length $\delta L$ in vacuum translates into a physical length on a quartz-glass substrate of 9.9 mm and 4.9 mm in a linear-type resonator. This calculation implies, if the wavelength mapped delay circuit 1-4 shown in FIG. 30 is employed, $\delta L_i$ has to be less than 4.9 mm.

(Variable Propagation Delay-No. 1)

Figure 32:
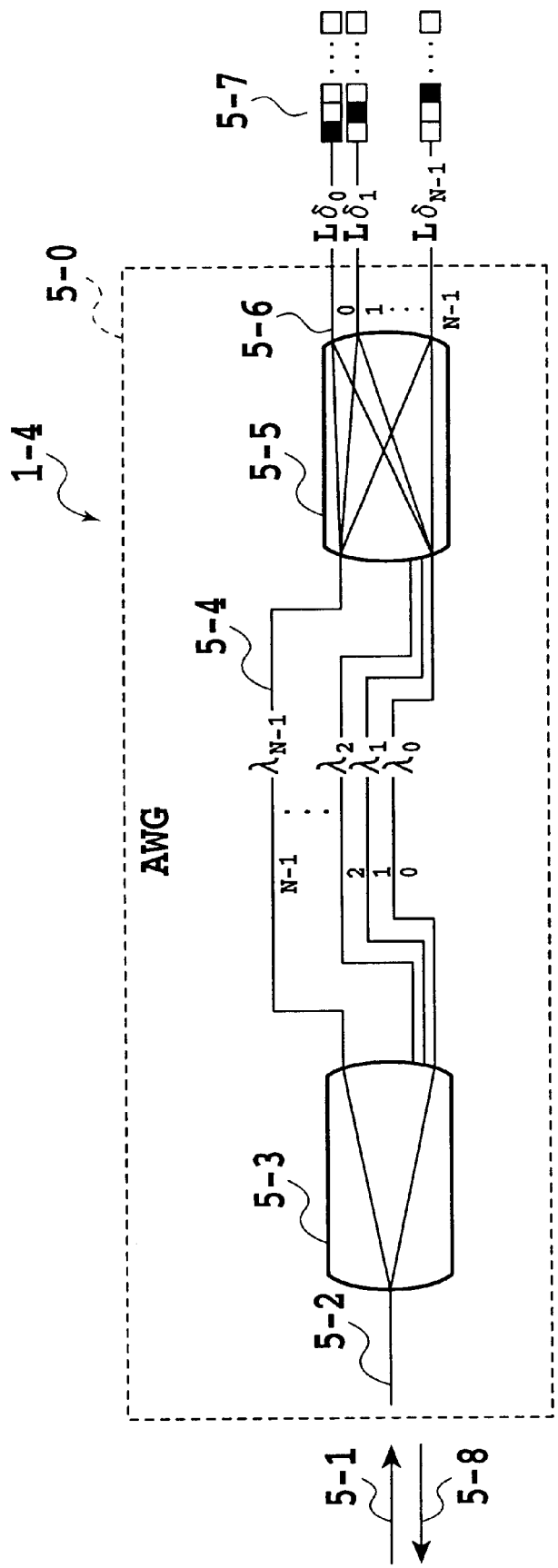
FIG. 32 is a block diagram illustrating the configuration of a time-to-wavelength mapped mode-locked laser that produces a variable propagation delay of a twelfth example of the invention.

FIG. 32 shows an example of the methods for producing variable propagation delay.

This configuration is almost the same as that of FIG. 29, but this example uses an N×N compact mirror array 5-7 (MEMS) that can change reflection conditions mechanically at the output of N waveguides 5-6.

At the exit of a waveguide 5-6, N mirrors are arranged and each mirror either passes or reflects light. If one of the N mirrors corresponding to a waveguide 5-6 is set in reflection state, the light emitted from the waveguide 5-6 is returned there.

The returned light is transmitted in AWG 5-0 in the reverse direction and output from the input/output waveguide. By selection the mirror for reflection, the amount of propagation delay $D_i$ can be controlled and thereby the relation between wavelength $\lambda_i$ and $D_i$ becomes variable.

For example, in the mirror array 5-7 shown in FIG. 32, the black mirrors are set in reflection state and the white ones in transparent state. According to position of mirrors for setting reflection state determines the length $\delta L_i$. When the relation between $\lambda_i$ and $D_i$ can be changed, the relation between clock frequency $f_i$ and wavelength $\lambda_i$ becomes accordingly variable.

(Variable Propagation Delay-No. 2)

Figure 33A:
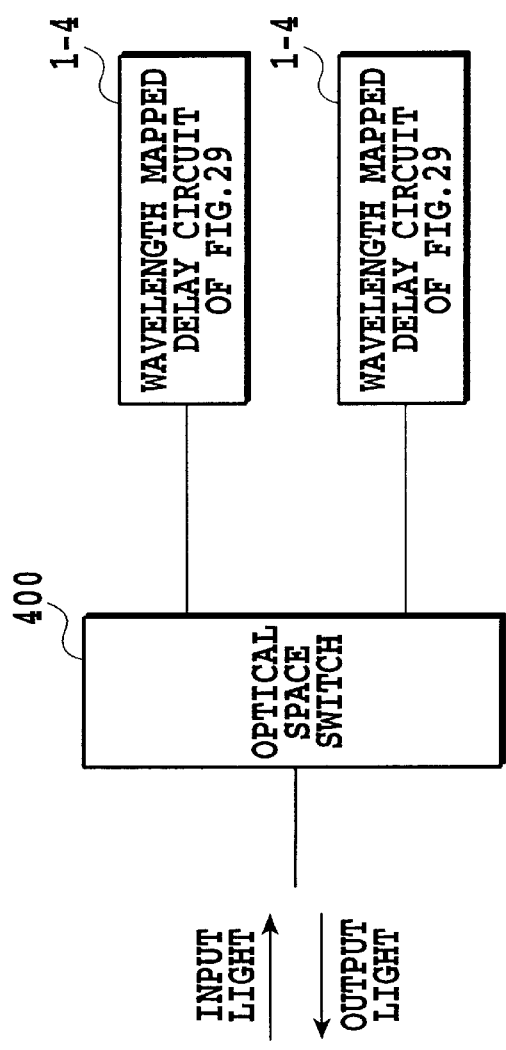
FIGS. 33A and 33B are block diagrams illustrating the configuration of another time-to-wavelength mapped mode-locked laser that produces a variable propagation delay.
Figure 33B:
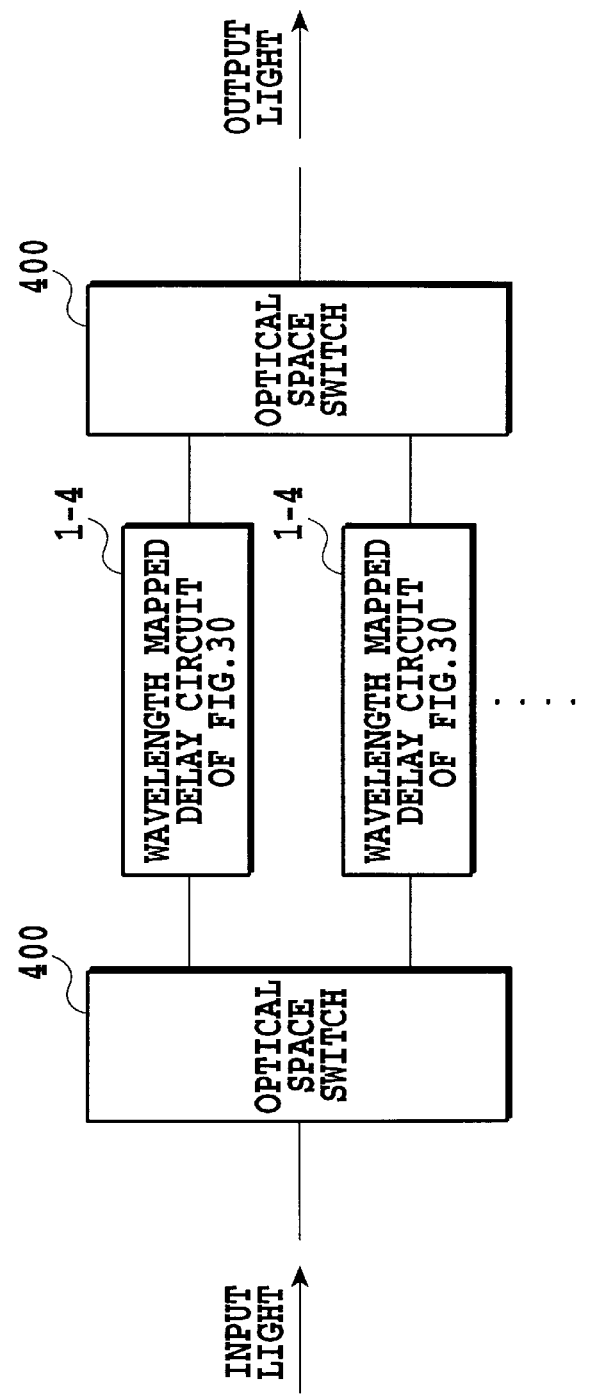

FIGS. 33A and 33B show another example of the methods for producing variable propagation delay.

In FIGS. 33A and 33B, there are a plurality of wavelength mapped delay circuits 1-9 shown in FIG. 29 or 30, and an optical space switch 400 selects one of those wavelength mapped delay circuits 1-4.

If each wavelength mapped delay circuit 1-4 has different properties, a selected wavelength mapped delay circuit 1-4 provides its own oscillation characteristics and thereby the relation between clock frequency $f_i$ and wavelength $\lambda_i$ becomes variable.

When erbium is doped in the quartz waveguide 7-0 and it is excited by a beam having wavelength of 1.48 $\mu$m or 0.98 $\mu$m, together with the use of an In—Ga—As—P semiconductor amplifier, a laser at the 1.55 $\mu$m band oscillation, which is an important band in optical communications, is provided.

ELEVENTH EXAMPLE

Next, an eleventh example of the invention is explained with reference to FIG. 31.

In this embodiment, a configuration of laser circuit integrated on a semiconductor substrate is described. In FIG. 31, the laser resonator 7-12 is a linear-type resonator. Then the wavelength mapped delay circuit 1-4 shown in FIG. 29 or 30 can be used. The whole functions of the resonator 7-12 are integrated on a semiconductor substrate.

As optical modulator 7-2, an electro-absorption optical modulator is employed. As optical amplifier 7-3, an optical semiconductor amplifier is used.

When the repetition frequency is low (for example, less than 5 GHz), the function of optical modulator 1-3 can be realized by modulating the injection current put in the semiconductor amplifier. In this case, there is an advantage that the optical amplifier 1-2 and the optical modulator 1-3 can be integrated into one device.

The driving signal 7-11 for the optical modulator 7-2 is generated by a driver 7-10. In the driver 7-10, the driving signal generator uses an RF oscillator having frequency-variabled and a DC power source. The driving signal 7-11 includes a clock signal of frequency $f_i$ and DC bias signals.

The output light 7-9 is obtained from the light that has passed the mirror 7-1 terminating the one end of the resonator 7-12. The other end of the resonator 7-12 is terminated by are flection unit 7-8, which is a fixed mirror or an MEMS mirror array. By the use of a In—Ga—As—P substrate, laser at the 1.55 $\mu$m-band oscillation, which is an important band in optical communications, is provided.

TWELFTH EXAMPLE

Next, a twelfth example of the invention is explained with reference to FIGS. 32–33.

In this embodiment, a configuration of laser circuit integrated on a quartz-glass substrate is described. Since the basic structure is the same as that of the eleventh example, description is made referring to FIG. 31.

Figure 31:
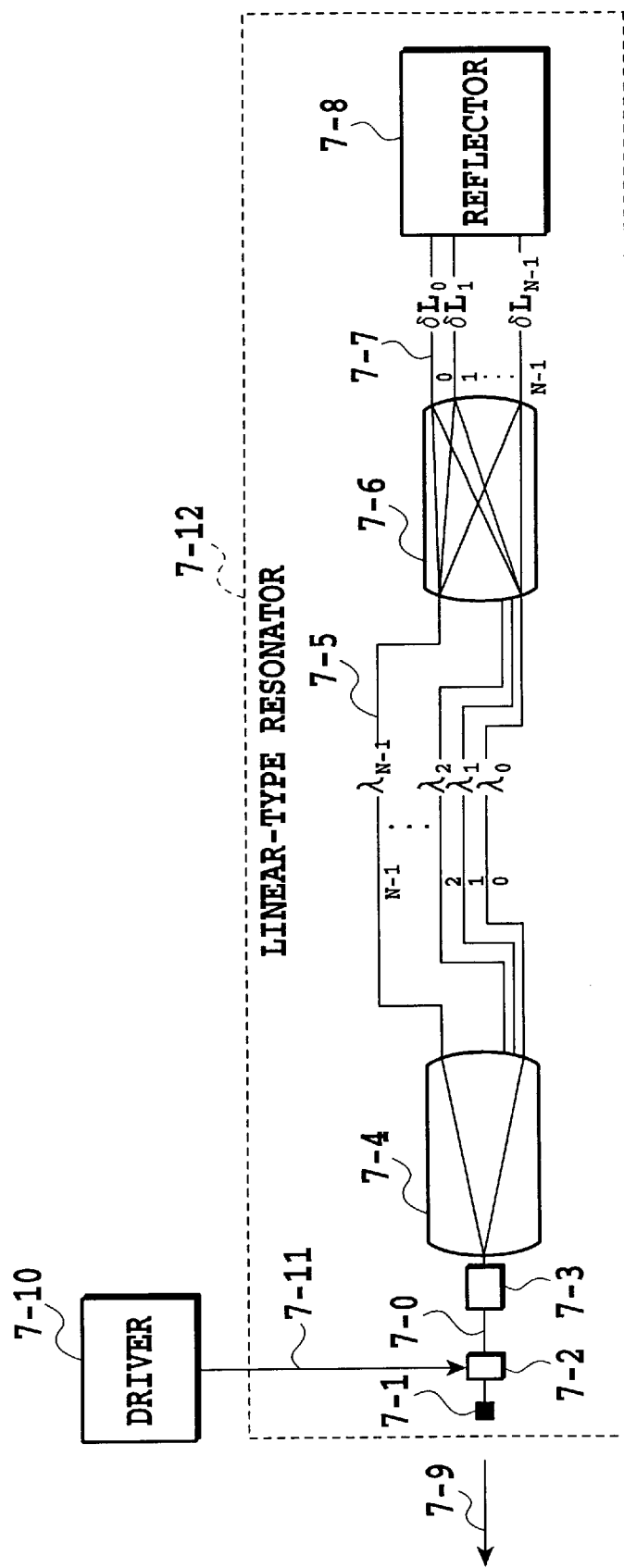
FIG. 31 is a block diagram illustrating the configuration of the time-to-wavelength mapped mode-locked laser of an eleventh example of the invention.

In FIG. 31, the whole functions of resonator 7-12 are integrated on a quartz-glass substrate. As optical modulator 7-2, an electro-absorption optical modulator or a LNMZ modulator can be employed, and they are integrated on the quartz substrate with a hybrid structure.

When the repetition frequency is low (for example, less than 5 GHz), the function of optical modulator 1-3 can be realized by modulating the injection current put in the semiconductor amplifier. In this case, there is an advantage that the optical amplifier 1-2 and the optical modulator 1-3 can be integrated into one device.

In addition, rare-earth elements can be doped in a quartz waveguide 7.0 to make an optical amplifier 7.3. Optical amplification can be performed by exciting this doped part.

The driving signal 7.11 for the optical modulator 7.2 is generated by a driver 7.10. In the driver 7.10, the driving signal generator uses an RF oscillator of which frequency is variable and a DC power source. The driving signal 7.11 included a clock signal of a frequency $f_i$ and DC bias signals.

The output light 7.9 is obtained from the light that has passed the mirror 7.1 terminating the one end of the resonator 7.12. The other end of the resonator 7.12 is terminated by the reflection unit 7.8, which is a fixed mirror (FIG. 29) or an MEMS mirror array shown in FIG. 32.

THIRTEENTH EXAMPLE

Next, a thirteenth example of the present invention is explained with reference to FIG. 34.

This embodiment is an example of the configuration of a time-to-wavelength mapped mode-locked laser where an optical time division multiplexing circuit 6-11 is further connected to the output of the resonator 1-1 as a light source employed in the transmitter.

Note that the configuration of the time-to-wavelength mapped mode-locked laser including the resonator 1-1 itself is not repeated here because it is the same as that described in FIG. 27 for the tenth example of the invention.

An example of the configuration of the optical time division multiplexing circuit 6-11 is explained below.

The repetition frequency of the time-to-wavelength mapped mode-locked laser 1-1 is now $f_L$ (repetition interval $T_L=1/f_L$), and the output light is entered into the optical time division multiplexing circuit 6-11.

Among a variety of methods for implementing the optical time division multiplexing circuit 6-11, this embodiment employs optical direction-selective couplers and optical waveguides. The input pulse train is separated into K waveguides 6.8 by 1×K optical direction-selective couplers (K≧1).

Each waveguide has a different length and then the propagation delay corresponding to each length becomes $kT_c/K$, where integer k meets a condition 0≦k<K and labels one of the waveguides 6.8. $T_c$ is the central value of the repetition intervals.

When delayed pulse trains are merged by K×1 optical direction-selective couplers 6.9, a pulse train 6-10 is output that has repetition frequencies of which average value is $Kf_L$. In this case, since $T_c$ is a fixed value and $T_L$ changes, the repetition frequency is multiplied by an integer only when $T_c$ is equal to $T_L$ in the optical time division multiplexing circuit 6-11. The average value of the repetition frequencies, therefore, should be focused on in consideration.

Figure 34:
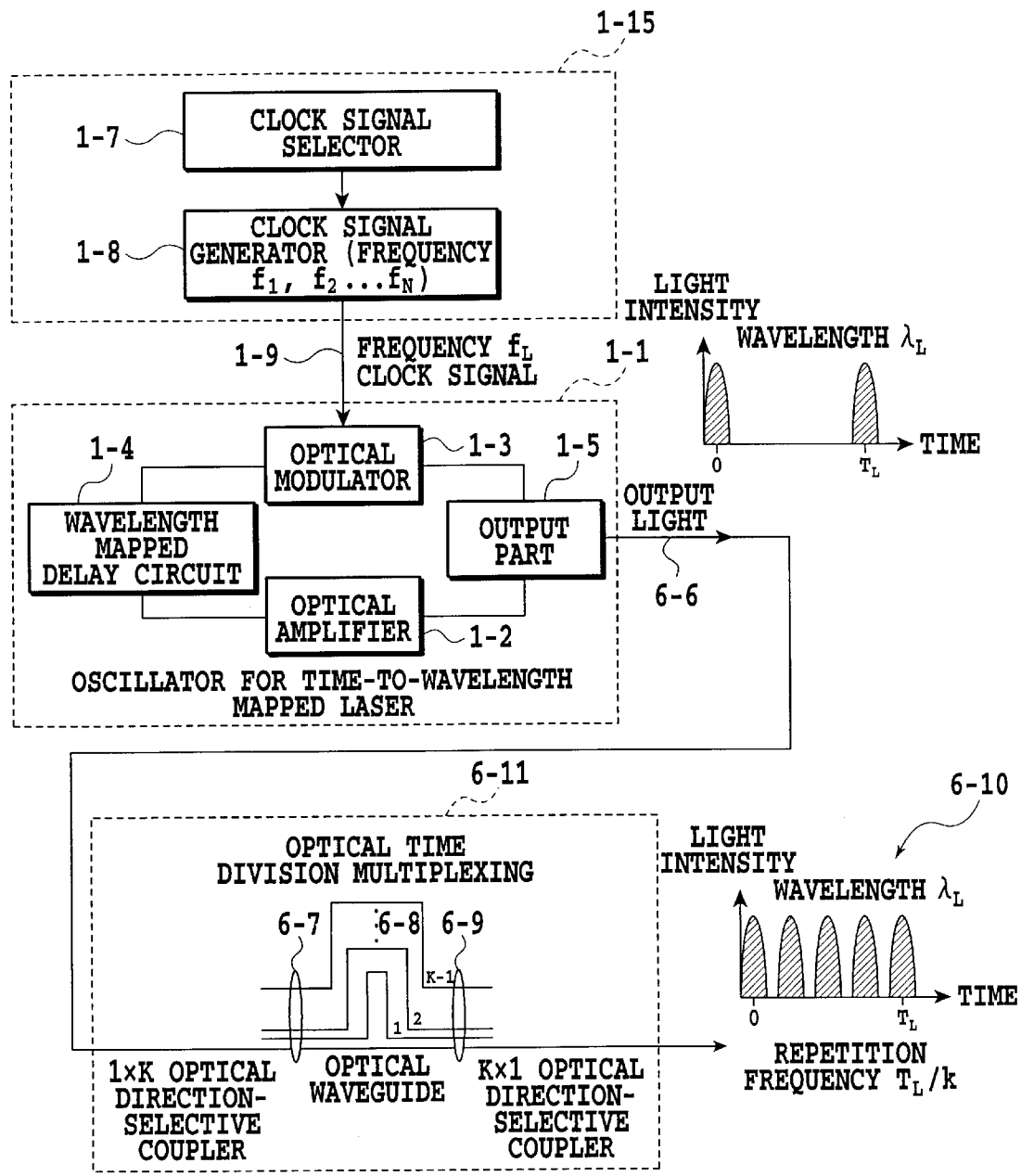
FIG. 34 is a block diagram illustrating the configuration of a time-to-wavelength mapped mode-locked laser equipped with an optic time division multiplexing circuit of a thirteenth example of the invention.
Figure 35:
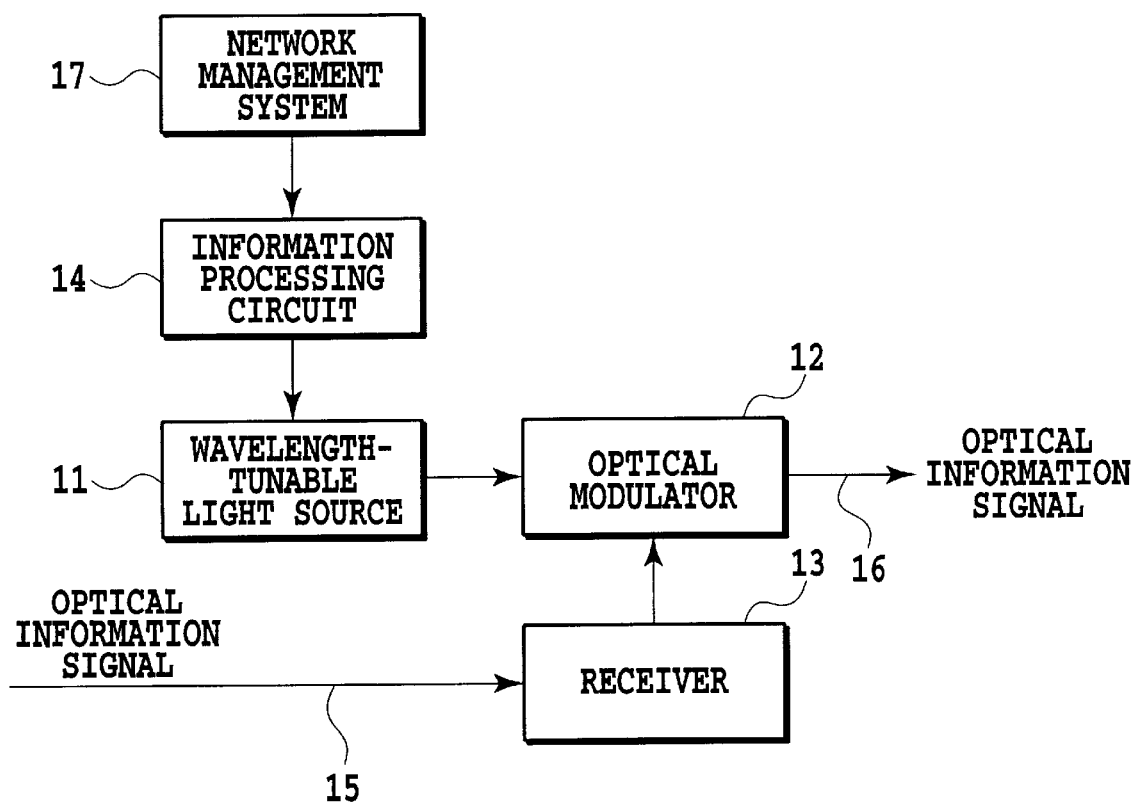
FIG. 35 is a block diagram illustrating the configuration of a wavelength converter of prior art.
Figure 36:
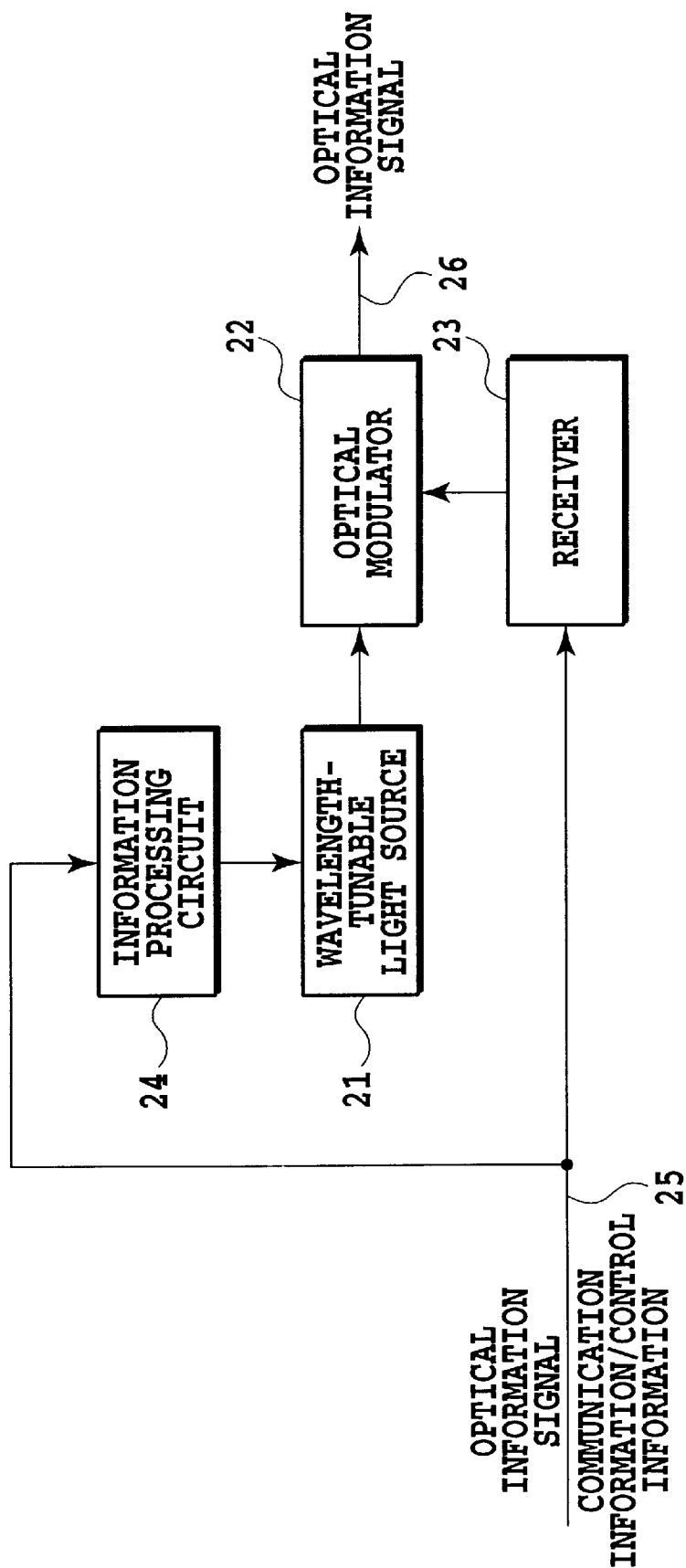
FIG. 36 is a block diagram illustrating the configuration of another wavelength converter of prior art.

The configuration shown in FIG. 34 enables a data transmission at a rate similar to the repetition frequency of the time-to-wavelength mapped mode-locked laser 1-1 or even higher rates.

Such transmission becomes possible when a condition is met that the average repetition frequency of the light source $Kf_L \gg R_{max}$ ($R_{max}$: the maximum transmission rate) and a low-pass filter is used that satisfies a condition $R_{max} < f_{cut} < Kf_L$ upon receiving optical information signals.

However, there is a limitation in the maximum degree of multiplexing. If the repetition frequency of the time-to-wavelength mapped mode-locked laser is $T_L=1/f_L$ and the pulse width is $T_p$, a relation $K<T_L/T_p$ is required to be fulfilled.

As described above, this invention enables to split light into beams in waveguides and provide a propagation delay to each light beam of a different wavelength, because a signal generation means, such as arrayed-waveguide grating, is installed in the resonator to which a clock signal corresponding to a predetermined wavelength is input. This signal generation means can generate an output signal having an oscillation wavelength which has an arbitrary interval independent of the wavelength of the clock signal and a different propagation delay for each wavelength. Thereby a wavelength mapped delay circuit and a time-to-wavelength mapped mode-locked laser can be manufactured that operate at many wavelengths in a narrow wavelength band.

This invention also enables to control the length of resonator for the light of each wavelength independently from each other, owing to the above signal generating means. Therefore, the relation between mode-locked frequency and oscillation wavelength becomes variable, and a communications system that allows an arbitrary combination of mode-locked frequency and oscillation wavelength is provided.

Also in this invention, the transmission signal is produced from a control signal that has the same frequency as that of the transmitted information and the clock signal corresponding to the desired wavelength, and the extracted control signal is used as the clock signal that drives the time-to-wavelength mapped mode-locked laser. Therefore, a wavelength converter that eliminates the need for complex information processing circuits, can be obtained.

In addition, the present invention employs a transmission system where the repetition frequency $f_L$ of a pulse train output from a transmitter or wavelength converter utilizing the time-to-wavelength mapped mode-locked laser is controlled to be sufficiently higher than the transmission rate R ($f_L \gg R$), the transmission information is conveyed by the envelope component of the transmission signals, the receiver extracts this envelope component with a low-pass filter, and the transmission information is decoded by identifying the envelope component. As a result, a transmission system that operates at a fixed speed, varying the repetition patterns of the pulse train provided from the time-to-wavelength mapped mode-locked laser can be obtained.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. The wavelength-tunable mode-locked laser comprising:
   a resonator for receiving a clock signal corresponding to a predetermined wavelength, the resonator having:
      a signal generation means for producing an output signal having an oscillation wavelength, wherein the oscillation wavelength has an arbitrary wavelength interval that is independent of the predetermined wavelength of said clock signal, and a different propagation delay for each wavelength,
      wherein a repetition frequency $f_L$ of the output signal from said resonator has a bandwidth of $\Delta f_L$ around the center $f_L$ ($\Delta f_L \ll f_L$), wherein the transmission rate R of the transmission signal corresponding to said clock signal fulfills the relation $$R \ll f_L,$$

and wherein a plurality of pulses correspond to one bit of said transmission signal.

2. A wavelength converter for converting a transmission signal into a new wavelength output signal, the converter comprising:
   a wavelength-tunable light source comprising a wavelength-tunable mode-locked laser, the wavelength-tunable mode-locked laser comprising:
      a resonator for receiving a clock signal corresponding to a predetermined wavelength, the resonator having:
         a signal generation means for producing an output signal having an oscillation wavelength, wherein the oscillation wavelength has an arbitrary wavelength interval that is independent of the predetermined wavelength of said clock signal, and a different propagation delay for each wavelength, and wherein
      said transmission signal is converted into said new wavelength signal by modulating said output signal produced from said wavelength-tunable light-source.

3. The wavelength converter of claim 2, wherein the wavelength of said output signal produced from said wavelength-tunable light source is determined by the control information included in said transmission signal.

4. The wavelength converter of claim 3, wherein the said control information has the same frequency as that of said clock signal.

5. A wavelength router comprising a wavelength separation means connected to an output terminal of a wavelength converter for converting a transmission signal into a new wavelength output signal, the wavelength converter comprising:
   a wavelength-tunable light source comprising a wavelength-tunable mode-locked laser, the wavelength-tunable mode-locked laser comprising:
      a resonator for receiving a clock signal corresponding to a predetermined wavelength, the resonator having:
         a signal generation means for producing an output signal having an oscillation wavelength, wherein the oscillation wavelength has an arbitrary wavelength interval that is independent of the predetermined wavelength of said clock signal, and a different propagation delay for each wavelength, and wherein
      said transmission signal is converted into said new wavelength signal by modulating said output signal produced from said wavelength-tunable light source.

6. A transmission system for sending information at a fixed transmission rate, the system comprising:
   transmitting equipment comprising:
      a wavelength-tunable mode-locked comprising:
         a resonator for receiving a clock signal corresponding to a predetermined wavelength, the resonator having:
            a signal generation means for producing an output signal having an oscillation wavelength, wherein the oscillation wavelength has an arbitrary wavelength interval that is independent of the wavelength of said clock signal, and a different propagation delay for each wavelength,
            wherein a repetition frequency $f_L$ of the output signal from said resonator has a bandwidth of $\Delta f_L$ around the center $f_L$ ($\Delta f_L \ll f_L$), wherein the transmission rate R of the transmission signal corresponding to said clock signal fulfills the relation $$R \ll f_L,$$

and wherein a plurality of pulses correspond to one bit of said transmission signal; and an output means for outputting, from said wavelength-tunable mode-locked laser, an output signal in which the repetition frequency is sufficiently higher than the transmission rate, and in which an envelope component corresponds to transmission information; and receiving equipment comprising:

a low-pass filter for extracting the envelope component from said output signal by using a predetermined cut-off frequency; and a decoding means for decoding said transmission information by identifying the envelope component extracted from said low-pass filter.

7. A transmission system for sending information at a fixed transmission rate, the system comprising:

transmitting equipment comprising:

a wavelength converter for converting a transmission signal into a new wavelength output signal comprising:

a wavelength-tunable light source comprising a wavelength-tunable mode-locked laser, the wavelength-tunable mode-locked laser comprising:

a resonator for receiving a clock signal corresponding to a predetermined wavelength, the resonator having:

a signal generation means for producing an output signal having an oscillation wavelength, wherein the oscillation wavelength has an arbitrary wavelength interval that is independent of the wavelength of said clock signal, and a different propagation delay for each wavelength, and wherein said transmission signal is converted into said new wavelength signal by modulating said output signal produced from said wavelength-tunable light source; and an output means for outputting, from said wavelength-tunable mode-locked laser, an output signal in which the repetition frequency is sufficiently higher than the transmission rate, and in which an envelope component corresponds to transmission information; and receiving equipment comprising:

a low-pass filter for extracting the envelope component from said output signal by using a predetermined cut-off frequency; and a decoding means for decoding said transmission information by identifying the envelope component extracted from said low-pass filter.

8. The transmission system of claim 6, wherein said low pass filter of said receiving equipment removes a component of said output signal corresponding to a pulse train, wherein said predetermined cut-off frequency $f_{cut}$ of said low-pass filter meets the condition $$R < f_{cut} < f_{min},$$

and wherein R is said transmission rate is R and $f_{min}$ is a minimum value of said repetition frequency.

9. The transmission system of claim 8, further comprising:

an optical time division multiplexing circuit having a multiplexing degree K, wherein said optical time division multiplexing circuit is connected to the output of said wavelength-tunable mode-locked laser, wherein the output light from said wavelength-tunable mode-locked laser is an output light from said optical time division multiplexing circuit, and wherein an average repetition frequency of the pulse train of said output signal is $Kf_L$, and a minimum value of said average repetition frequency is $Kf_{min}$.

10. The transmission system of claim 7, wherein said low pass filter of said receiving equipment removes a component corresponding to a pulse train, wherein said predetermined cut-off frequency $f_{cut}$ of said low-pass filter meets the condition $$R < f_{cut} < f_{min}$$

and wherein R is said transmission rate and $f_{min}$ is a minimum value of said repetition frequency.

11. The transmission system of claim 10, further comprising:

an optical time division multiplexing circuit having a multiplexing degree K, wherein said optical time division multiplexing circuit is connected to the output of said wavelength-tunable mapped mode-locked laser, wherein the output light from said wavelength-tunable mode-locked laser is an output light from said optical time division multiplexing circuit, and wherein an average repetition frequency of the pulse train of said output signal is $Kf_L$, and a minimum value of said average repetition frequency is $Kf_{min}$.

* * * * *

UNITED STATES PATENT AND TRADEMARK OFFICE
CERTIFICATE OF CORRECTION

PATENT NO.    : 6,631,145 B1
DATED         : October 7, 2003
INVENTOR(S)   : Tamura et al.

It is certified that error appears in the above-identified patent and that said Letters Patent is hereby corrected as shown below:

<u>Title page,</u>
Item [56], References Cited, OTHER PUBLICATIONS, "Shiu" should read -- Shu --.

<u>Column 24,</u>
Line 24, "light-source" should read -- light source --;
Lines 27 and 29, cancel "the".

Signed and Sealed this

Sixteenth Day of December, 2003

JAMES E. ROGAN
*Director of the United States Patent and Trademark Office*